(12) United States Patent
Yamazaki

(10) Patent No.: US 9,842,941 B2
(45) Date of Patent: Dec. 12, 2017

(54) SEMICONDUCTOR DEVICE AND MANUFACTURING METHOD THEREOF

(71) Applicant: Semiconductor Energy Laboratory Co., Ltd., Atsugi-shi, Kanagawa-ken (JP)

(72) Inventor: Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/216,045

(22) Filed: Jul. 21, 2016

(65) Prior Publication Data

US 2016/0329437 A1 Nov. 10, 2016

Related U.S. Application Data

(63) Continuation of application No. 14/479,646, filed on Sep. 8, 2014, now Pat. No. 9,406,761.

(30) Foreign Application Priority Data

Sep. 13, 2013 (JP) .................................. 2013-190136

(51) Int. Cl.
*H01L 29/78* (2006.01)
*H01L 29/786* (2006.01)
(Continued)

(52) U.S. Cl.
CPC .. *H01L 29/78696* (2013.01); *C23C 16/45525* (2013.01); *C23C 16/483* (2013.01);
(Continued)

(58) Field of Classification Search
CPC ........... H01L 29/78696; H01L 29/7869; H01L 29/24; H01L 29/66969; H01L 27/1052;
(Continued)

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

CN 103339715 A 10/2013
DE 112011104002 8/2013
(Continued)

OTHER PUBLICATIONS

Chung.Y et al., "High performance AMOLED Displays base on a-IGZO TFTs with high mobility by MOCVD technology", IMID 2013 (The 13th International Meeting on Information Display), Aug. 26, 2013, pp. 354-355.
(Continued)

*Primary Examiner* — Roy Potter
*Assistant Examiner* — Paul Patton
(74) *Attorney, Agent, or Firm* — Robinson Intellectual Property Law Office; Eric J. Robinson

(57) ABSTRACT

A transistor having high field-effect mobility is provided. A transistor having stable electrical characteristics is provided. A transistor having low off-state current (current in an off state) is provided. Alternatively, a semiconductor device including the transistor is provided. The semiconductor device includes a first insulating film, an oxide semiconductor film over the first insulating film, a second insulating film over the oxide semiconductor film, and a conductive film overlapping with the oxide semiconductor film with the first insulating film or the second insulating film provided between the oxide semiconductor film and the conductive film. The composition of the oxide semiconductor film changes continuously between the first insulating film and the second insulating film.

9 Claims, 26 Drawing Sheets

(51) Int. Cl.
*H01L 29/26* (2006.01)
*H01L 29/66* (2006.01)
*C23C 16/455* (2006.01)
*C23C 16/48* (2006.01)
*G06K 19/07* (2006.01)
*H01L 27/105* (2006.01)
*H01L 27/12* (2006.01)
*H01L 29/24* (2006.01)
*G02F 1/1343* (2006.01)
*G02F 1/1362* (2006.01)
*G02F 1/1368* (2006.01)
*H01L 27/32* (2006.01)

(52) U.S. Cl.
CPC ...... *G06K 19/0723* (2013.01); *H01L 27/1052* (2013.01); *H01L 27/1225* (2013.01); *H01L 29/24* (2013.01); *H01L 29/26* (2013.01); *H01L 29/66075* (2013.01); *H01L 29/66969* (2013.01); *H01L 29/7869* (2013.01); *H01L 29/78648* (2013.01); *G02F 1/1368* (2013.01); *G02F 1/134309* (2013.01); *G02F 1/136213* (2013.01); *G02F 1/136286* (2013.01); *G02F 2201/123* (2013.01); *H01L 27/3262* (2013.01)

(58) Field of Classification Search
CPC ............. H01L 27/1225; H01L 27/3262; C23C 16/45525; C23C 16/483; G02F 1/136213; G02F 2201/123; G02F 1/1368; G06K 19/0723
See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,237,166 B2 | 8/2012 | Kumomi et al. |
| 8,547,771 B2 | 10/2013 | Koyama |
| 8,669,556 B2 | 3/2014 | Yamazaki et al. |
| 8,680,522 B2 | 3/2014 | Yamazaki et al. |
| 8,796,683 B2 | 8/2014 | Yamazaki |
| 8,847,220 B2 | 9/2014 | Yamazaki |
| 8,890,159 B2 | 11/2014 | Yamazaki et al. |
| 8,901,557 B2 | 12/2014 | Yamazaki |
| 8,921,853 B2 | 12/2014 | Yamazaki |
| 8,952,377 B2 | 2/2015 | Yamazaki et al. |
| 8,952,381 B2 | 2/2015 | Yamazaki |
| 8,963,148 B2 | 2/2015 | Matsubayashi et al. |
| 8,981,372 B2 | 3/2015 | Yamazaki |
| 9,018,624 B2 | 4/2015 | Yamazaki |
| 9,082,863 B2 | 7/2015 | Yamazaki |
| 9,153,699 B2 | 10/2015 | Yamazaki |
| 9,166,021 B2 | 10/2015 | Tezuka et al. |
| 9,166,060 B2 | 10/2015 | Yamazaki et al. |
| 9,190,527 B2 | 11/2015 | Tezuka et al. |
| 9,209,256 B2 | 12/2015 | Tokunaga et al. |
| 9,209,307 B2 | 12/2015 | Yamazaki et al. |
| 9,219,161 B2 | 12/2015 | Yamazaki |
| 9,231,111 B2 | 1/2016 | Yamazaki et al. |
| 9,240,492 B2 | 1/2016 | Yamazaki |
| 9,245,958 B2 | 1/2016 | Yamazaki |
| 9,257,569 B2 | 2/2016 | Yamazaki et al. |
| 9,269,821 B2 | 2/2016 | Yamazaki |
| 9,276,125 B2 | 3/2016 | Shimomura et al. |
| 9,281,408 B2 | 3/2016 | Yamazaki et al. |
| 9,281,409 B2 | 3/2016 | Yamazaki et al. |
| 9,293,540 B2 | 3/2016 | Yamazaki |
| 9,293,544 B2 | 3/2016 | Yamazaki |
| 9,293,602 B2 | 3/2016 | Yamazaki |
| 9,306,079 B2 | 4/2016 | Yamazaki et al. |
| 9,324,875 B2 | 4/2016 | Yamazaki |
| 9,324,876 B2 | 4/2016 | Kobayashi et al. |
| 9,331,100 B2 | 5/2016 | Yamazaki |
| 9,337,344 B2 | 5/2016 | Hanaoka |
| 9,343,579 B2 | 5/2016 | Yamazaki et al. |
| 9,368,636 B2 | 6/2016 | Kurata et al. |
| 9,373,711 B2 | 6/2016 | Yamazaki et al. |
| 9,391,096 B2 | 7/2016 | Yamazaki et al. |
| 9,401,714 B2 | 7/2016 | Yamazaki et al. |
| 9,406,810 B2 | 8/2016 | Yamazaki |
| 9,412,877 B2 | 8/2016 | Tanaka et al. |
| 9,477,294 B2 | 10/2016 | Nishijima et al. |
| 9,595,435 B2 | 3/2017 | Tsubuku et al. |
| 9,601,632 B2 | 3/2017 | Yamazaki et al. |
| 9,627,545 B2 | 4/2017 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |

(56) References Cited

U.S. PATENT DOCUMENTS

| | | |
|---|---|---|
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0314618 A1 | 12/2010 | Tanaka et al. |
| 2011/0048325 A1 | 3/2011 | Choi et al. |
| 2011/0143035 A1 | 6/2011 | Cho et al. |
| 2012/0138922 A1 | 6/2012 | Yamazaki et al. |
| 2013/0320334 A1 | 12/2013 | Yamazaki et al. |
| 2014/0008647 A1 | 1/2014 | Yamazaki |
| 2014/0027762 A1 | 1/2014 | Tsurume et al. |
| 2014/1001494 | 1/2014 | Yamazaki |
| 2014/0103335 A1 | 4/2014 | Yamazaki et al. |
| 2014/1011070 | 4/2014 | Yamazaki |
| 2014/0183532 A1 | 7/2014 | Yamazaki et al. |
| 2014/0210835 A1* | 7/2014 | Hong ............... H01L 29/78696 345/530 |
| 2014/0264320 A1 | 9/2014 | Liang et al. |
| 2014/1036128 | 12/2014 | Suzawa |
| 2015/0028330 A1 | 1/2015 | Yamazaki et al. |
| 2015/0034949 A1 | 2/2015 | Yamazaki |

FOREIGN PATENT DOCUMENTS

| | | |
|---|---|---|
| EP | 1737044 A | 12/2006 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2006-165531 A | 6/2006 |
| JP | 2010-287735 A | 12/2010 |
| JP | 2012-059860 | 3/2012 |
| JP | 2012-059860 A | 3/2012 |
| JP | 2012-134475 A | 7/2012 |
| JP | 2012-257187 A | 12/2012 |
| JP | 2013-138197 A | 7/2013 |
| KR | 2010-0133314 A | 12/2010 |
| KR | 2013-0118921 A | 10/2013 |
| TW | 201236157 | 9/2012 |
| TW | 201341549 | 10/2013 |
| WO | WO-2004/114391 | 12/2004 |
| WO | WO-2012/073844 | 6/2012 |
| WO | WO-2013/081128 | 6/2013 |

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m = 3, 4, and 5), $InGaO_3(ZnO)3$, and $Ga_2O_3(ZnO)m$ (m = 7, 8, 9, and 16) in the $In_2O_3$—$ZnGa_2O_4$—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)5$ films", Appl. Phys. Lett. (Applied Physics Letters), Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO

(56) References Cited

OTHER PUBLICATIONS (Ga2O3—In2O3—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and SN-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by Peald Grown ZnO TFT", IMID '07 Digest, 2007, pp. 1249-1252.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", Nirim Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu,or Zn] at Temperatures Over 1000° C", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

(56) References Cited

OTHER PUBLICATIONS

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters), 2005, vol. 87, pp. 122102-1-122102-3.

Oba.F et al., "Defect energetics in ZnO: A hybrid Hartree-Fock density functional study", Phys. Rev. B(Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

International Search Report (Application No. PCT/JP2014/074165) Dated Dec. 16, 2014.

Written Opinion (Application No. PCT/JP2014/074165) Dated Dec. 16, 2014.

\* cited by examiner continuous junction discontinuous junction

CAAC-OS nc-OS

4000

4000

4000

4000

4000

4000

SEMICONDUCTOR DEVICE AND MANUFACTURING METHOD THEREOF

TECHNICAL FIELD

The present invention relates to an object, a method, or a manufacturing method. Furthermore, the present invention relates to a process, a machine, manufacture, or a composition of matter. One embodiment of the present invention relates to a semiconductor device, a display device, a light-emitting device, a lighting device, a power storage device, a memory device, or a processor; a method for manufacturing a semiconductor film, a semiconductor device, a display device, a light-emitting device, a lighting device, a power storage device, a memory device, or a processor; a method for driving a semiconductor device, a display device, a light-emitting device, a lighting device, a power storage device, a memory device, or a processor. In particular, one embodiment of the present invention relates to a semiconductor device, a display device, or a light-emitting device each including an oxide semiconductor.

In this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

BACKGROUND ART

As the silicon film used as a semiconductor film of a transistor, either an amorphous silicon film or a polycrystalline silicon film is used depending on the purpose. For example, in the case of a transistor included in a large-sized display device, it is preferred to use an amorphous silicon film, which can be formed using the established technique for forming a film on a large-sized substrate. On the other hand, in the case of a transistor included in a high-performance display device where driver circuits are formed over the same substrate, it is preferred to use a polycrystalline silicon film, which can form a transistor having a high field-effect mobility. As a method for forming a polycrystalline silicon film, high-temperature heat treatment or laser light treatment which is performed on an amorphous silicon film has been known.

In recent years, an oxide semiconductor film has attracted attention. For example, a transistor which includes an amorphous oxide semiconductor film containing indium, gallium, and zinc is disclosed (see Patent Document 1).

An oxide semiconductor film can be formed by a sputtering method or the like, and thus can be used for a channel formation region of a transistor in a large display device. Moreover, a transistor including an oxide semiconductor film has a high field-effect mobility; therefore, a high-performance display device where driver circuits are formed over the same substrate can be obtained. In addition, there is an advantage that capital investment can be reduced because part of production equipment for a transistor including an amorphous silicon film can be retrofitted and utilized.

A transistor including an oxide semiconductor film is known to have extremely small leakage current in an off state. For example, a low-power CPU and the like utilizing the small leakage current of a transistor including an oxide semiconductor film are disclosed (see Patent Document 2).

Patent Document 3 discloses that a transistor having high field-effect mobility can be obtained by a well potential formed using an active layer formed of semiconductor films.

REFERENCE

Patent Document

[Patent Document 1] Japanese Published Patent Application No. 2006-165528
[Patent Document 2] Japanese Published Patent Application No. 2012-257187
[Patent Document 3] Japanese Published Patent Application No. 2012-59860

DISCLOSURE OF INVENTION

One object is to provide a transistor having high field-effect mobility. Another object is to provide a transistor having stable electrical characteristics. Another object is to provide a transistor having low off-state current (current in an off state). Another object is to provide a semiconductor device including the transistor. Another object is to provide a novel semiconductor device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is (1) a semiconductor device including a first insulating film, an oxide semiconductor film over the first insulating film, a second insulating film over the oxide semiconductor film, and a conductive film overlapping with the oxide semiconductor film with one of the first insulating film and the second insulating film provided between the oxide semiconductor film and the conductive film. A composition of the oxide semiconductor film changes continuously between the first insulating film and the second insulating film.

Another embodiment of the present invention is (2) the semiconductor device described in (1) in which the oxide semiconductor film contains indium, an element M (aluminum, gallium, yttrium, or tin), and zinc; and the oxide semiconductor film has an element M concentration gradient that increases toward the first insulating film.

Another embodiment of the present invention is (3) the semiconductor device described in (1) in which the oxide semiconductor film contains indium, an element M (aluminum, gallium, yttrium, or tin), and zinc; and the oxide semiconductor film has an element M concentration gradient that increases toward the second insulating film.

Another embodiment of the present invention is (4) the semiconductor device described in (1) in which the oxide semiconductor film contains indium, an element M (aluminum, gallium, yttrium, or tin), and zinc; and the oxide semiconductor film has an element M concentration gradient that increases toward the first insulating film and an element M concentration gradient that increases toward the second insulating film.

Another embodiment of the present invention is (5) the semiconductor device described in any one of (1) to (4) in which the oxide semiconductor film includes a zinc oxide layer being in contact with the first insulating film and having a thickness of 0.1 atomic layers or more and 20 atomic layers or less.

Another embodiment of the present invention is (6) a semiconductor device including a first insulating film, an oxide semiconductor film over the first insulating film, a second insulating film over the oxide semiconductor film, and a conductive film overlapping with the oxide semiconductor film with the second insulating film provided between the oxide semiconductor film and the conductive film. The electron affinity of the oxide semiconductor film changes continuously between the first insulating film and the second insulating film.

Another embodiment of the present invention is (7) the semiconductor device described in (6) in which the oxide semiconductor film has a concentration gradient so that the electron affinity decreases toward the first insulating film.

Another embodiment of the present invention is (8) the semiconductor device described in (6) in which the oxide semiconductor film has a concentration gradient so that the electron affinity decreases toward the second insulating film.

Another embodiment of the present invention is (9) the semiconductor device described in (6) in which the oxide semiconductor film has a concentration gradient so that the electron affinity decreases toward the first insulating film and a concentration gradient so that the electron affinity decreases toward the second insulating film.

Another embodiment of the present invention is (10) a method for manufacturing a semiconductor device including the step of forming an oxide semiconductor film to be the oxide semiconductor film by a thermal chemical vapor deposition method while a flow rate ratio of source gases is changed. The semiconductor device includes a first insulating film, an oxide semiconductor film over the first insulating film, a second insulating film over the oxide semiconductor film, and a conductive film overlapping with the oxide semiconductor film with the first insulating film or the second insulating film provided between the oxide semiconductor film and the conductive film.

Another embodiment of the present invention is (11) the method for manufacturing the semiconductor device described in (10) in which a gas containing indium, a gas containing an element M (aluminum, gallium, yttrium, or tin), and a gas containing zinc are used as the source gas; and a step of decreasing the proportion of the gas containing the element M as film formation proceeds is included.

Another embodiment of the present invention is (12) the method for manufacturing the semiconductor device described in (10) in which a gas containing indium, a gas containing an element M (aluminum, gallium, yttrium, or tin), and a gas containing zinc are used as the source gas; and a step of increasing the proportion of the gas containing the element M as film formation comes to end is included.

Another embodiment of the present invention is (13) the method for manufacturing the semiconductor device, described in (10) in which a gas containing indium, a gas containing an element M (aluminum, gallium, yttrium, or tin), and a gas containing zinc are used as the source gas; and steps of decreasing the proportion of the gas containing the element M as film formation proceeds and increasing the proportion of the gas containing the element M as film formation comes to end are included.

Another embodiment of the present invention is (14) a method for manufacturing a semiconductor device including the step of forming an oxide semiconductor film to be the oxide semiconductor film by depositing a zinc oxide layer having a thickness of 0.1 atomic layers or more and 20 atomic layers or less using a gas containing zinc by a thermal chemical vapor deposition method, and then depositing a semiconductor film containing indium, an element M (aluminum, gallium, yttrium, or tin), and zinc by a thermal chemical vapor deposition method while flow rate ratio of a gas containing indium, a gas containing the element M, and a gas containing zinc is changed. The semiconductor device includes a first insulating film, an oxide semiconductor film over the first insulating film, a second insulating film over the oxide semiconductor film, and a conductive film overlapping with the oxide semiconductor film with the first insulating film or the second insulating film provided between the oxide semiconductor film and the conductive film.

Another embodiment of the present invention is (15) the method for manufacturing the semiconductor device described in (14) in which the semiconductor film containing indium, gallium, and zinc is deposited while the zinc oxide layer is grown as a seed crystal.

Another embodiment of the present invention is (16) the method for manufacturing the semiconductor device described in (14) or (15) in which the zinc oxide layer and the semiconductor film are successively deposited without exposure to the air.

A transistor having high field-effect mobility can be provided. A transistor having stable electrical characteristics can be provided. A transistor with low off-state current can be provided. A semiconductor device including the transistor can be provided. A novel semiconductor device can be provided. Note that one embodiment of the present invention is not limited to these effects. For example, depending on circumstances or conditions, one embodiment of the present invention might produce another effect. Furthermore, for example, depending on circumstances or conditions, one embodiment of the present invention might not produce any of the above effects.

BEST MODE FOR CARRYING OUT THE INVENTION

Figure 1A:
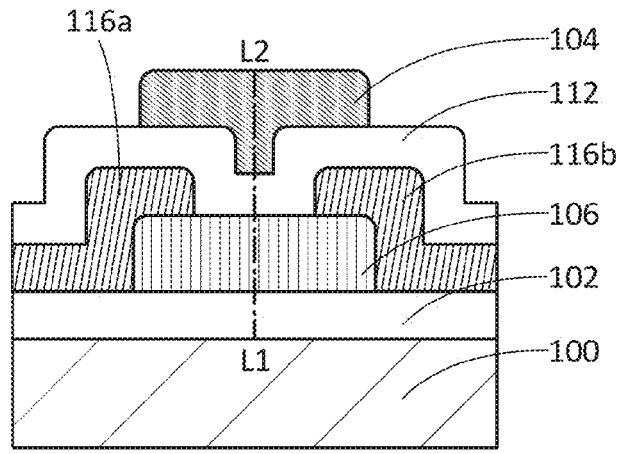
FIGS. 1A to 1C are a cross-sectional view and band diagrams of a transistor of one embodiment of the present invention.

Hereinafter, embodiments of the present invention will be described in detail with the reference to the drawings. However, the present invention is not limited to the description below, and it is easily understood by those skilled in the art that modes and details disclosed herein can be modified in various ways. Further, the present invention is not construed as being limited to description of the embodiments. In describing structures of the present invention with reference to the drawings, common reference numerals are used for the same portions in different drawings. Note that the same hatched pattern is applied to similar parts, and the similar parts are not especially denoted by reference numerals in some cases.

Note that the size, the thickness of films (layers), or regions in drawings is sometimes exaggerated for simplicity.

A voltage usually refers to a potential difference between a given potential and a reference potential (e.g., a ground potential (GND) or a source potential). A voltage can be referred to as a potential.

Note that the ordinal numbers such as "first" and "second" in this specification are used for convenience and do not denote the order of steps or the stacking order of layers. Therefore, for example, the term "first" can be replaced with the term "second", "third", or the like as appropriate. In addition, the ordinal numbers in this specification and the like are not necessarily the same as those which specify one embodiment of the present invention.

Note that a "semiconductor" includes characteristics of an "insulator" in some cases when the conductivity is sufficiently low, for example. Further, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Further, a "semiconductor" includes characteristics of a "conductor" in some cases when the conductivity is sufficiently high, for example. Further, a "semiconductor" and a "conductor" cannot be strictly distinguished from each other in some cases because a border between the "semiconductor" and the "insulator" is not clear. Accordingly, a "semiconductor" in this specification can be called a "conductor" in some cases. Similarly, a "conductor" in this specification can be called a "semiconductor" in some cases.

Note that an impurity in a semiconductor film refers to, for example, elements other than the main components of a semiconductor film. For example, an element with a concentration lower than 0.1 atomic % is an impurity. When an impurity is contained, the density of states (DOS) in a semiconductor film may be increased, the carrier mobility may be decreased, or the crystallinity may be decreased, for example. In the case where the semiconductor film is an oxide semiconductor film, examples of an impurity which changes characteristics of the semiconductor film include Group 1 elements, Group 2 elements, Group 14 elements, Group 15 elements, and transition metals other than the main components; specifically, there are hydrogen (included in water), lithium, sodium, silicon, boron, phosphorus, carbon, and nitrogen, for example. When the semiconductor film is an oxide semiconductor film, oxygen vacancies may be formed by entry of impurities such as hydrogen, for example. Further, when the semiconductor film is a silicon film, examples of an impurity which changes the characteristics of the semiconductor film include oxygen, Group 1 elements except hydrogen, Group 2 elements, Group 13 elements, and Group 15 elements.

<Transistor Having Continuous Junction>

A structure of a transistor of one embodiment of the present invention will be described below.

FIG. 1A is a cross-sectional view illustrating a structure of a transistor. The transistor in FIG. 1A includes an insulating film 102 over a substrate 100, a semiconductor film 106 over the insulating film 102, a conductive film 116a and a conductive film 116b which are in contact with a top surface of the semiconductor film 106, an insulating film 112 over the semiconductor film 106, the conductive film 116a, and the conductive film 116b, and a conductive film 104 overlapping with the semiconductor film 106 with the insulating film 112 provided therebetween. The conductive film 104 serves as a gate electrode of the transistor. Furthermore, the conductive film 116a and the conductive film 116b serve as a source electrode and a drain electrode of the transistor. In the transistor in FIG. 1A, the conductive film 116a and the conductive film 116b are in contact with the top surface of the semiconductor film 106; however, this embodiment is not limited to this. For example, the conductive film 116a and the conductive film 116b may be in contact with a bottom surface of the semiconductor film 106.

At least part (or all) of the conductive film 116a (and/or the conductive film 116b) is provided on at least part (or all) of a surface, a side surface, a top surface, and/or a bottom surface of a semiconductor film, e.g., the semiconductor film 106.

Alternatively, at least part (or all) of the conductive film 116a (and/or the conductive film 116b) is in contact with at least part (or all) of a surface, a side surface, a top surface, and/or a bottom surface of a semiconductor film. e.g., the semiconductor film 106. Further alternatively, at least part (or all) of the conductive film 116a (and/or the conductive film 116b) is in contact with at least part (or all) of a semiconductor film, e.g., the semiconductor film 106.

Alternatively, at least part (or all) of the conductive film 116a (and/or the conductive film 116b) is electrically connected to at least part (or all) of a surface, a side surface, a top surface, and/or a bottom surface of a semiconductor film, e.g., the semiconductor film 106. Alternatively, at least part (or all) of the conductive film 116a (and/or the conductive film 116b) is electrically connected to at least part (or all) of a semiconductor film, e.g., the semiconductor film 106.

Alternatively, at least part (or all) of the conductive film 116a (and/or the conductive film 116b) is provided near at least part (or all) of a surface, a side surface, a top surface, and/or a bottom surface of a semiconductor film, e.g., the semiconductor film 106. Alternatively, at least part (or all) of the conductive film 11l a (and/or the conductive film 116b) is provided near at least part (or all) of a semiconductor film. e.g., the semiconductor film 106.

Alternatively, at least part (or all) of the conductive film 116a (and/or the conductive film 116b) is provided on a side of at least part (or all) of a surface, a side surface, a top surface, and/or a bottom surface of a semiconductor film, e.g., the semiconductor film 106. Alternatively, at least part (or all) of the conductive film 116a (and/or the conductive film 116b) is provided on a side of at least part (or all) of a semiconductor film. e.g., the semiconductor film 106.

Alternatively, at least part (or all) of the conductive film 116a (and/or the conductive film 116b) is provided obliquely above at least part (or all) of a surface, a side surface, a top surface, and/or a bottom surface of a semiconductor film. e.g., the semiconductor film 106. Alternatively, at least part (or all) of the conductive film 116a (and/or the conductive film 116b) is provided obliquely above at least part (or all) of a semiconductor film, e.g., the semiconductor film 106.

Alternatively, at least part (or all) of the conductive film 116a (and/or the conductive film 116b) is provided above at least part (or all) of a surface, a side surface, a top surface, and/or a bottom surface of a semiconductor film, e.g., the semiconductor film 106. Alternatively, at least part (or all) of the conductive film 116a (and/or the conductive film 116b) is provided above at least part (or all) of a semiconductor film, e.g., the semiconductor film 106.

Figure 1B:
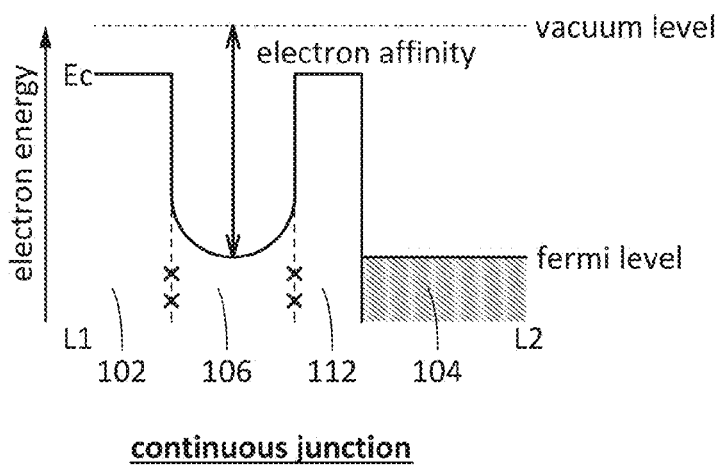
Figure 1C:
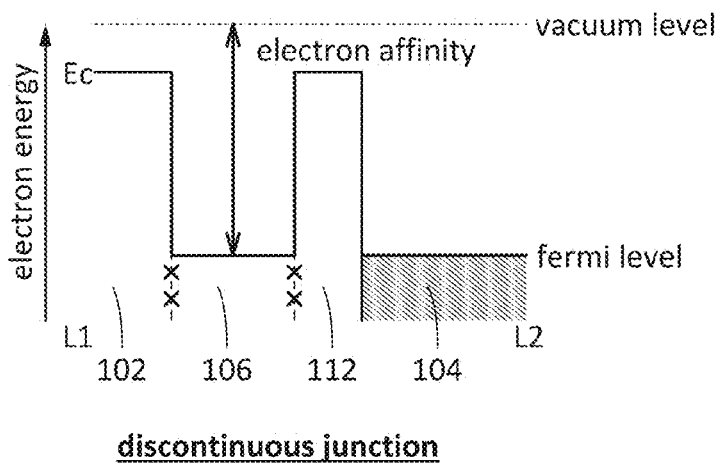

FIGS. 1B and 1C each illustrate a band diagram corresponding to the dashed-dotted line L1-L2 in FIG. 1A. In the band diagram, the energy (Ec) at the bottom of the conduction band of each of the insulating film 102, the semiconductor film 106, and the insulating film 112 and the Fermi level of the conductive film 104 are shown for easy understanding. An energy difference between a vacuum level and the bottom of the conduction band is referred to as electron affinity.

The case where the transistor in FIG. 1A is an n-channel transistor is described below. Note that application of the following description to a p-channel transistor will be readily conceived by those skilled in the art; thus, the description of the case is omitted.

In FIG. 1B, the electron affinity of the semiconductor film 106 changes continuously (not stepwise but smoothly) between the insulating film 102 and the insulating film 112. Specifically, the electron affinity of the semiconductor film 106 has a U-like shape including a gradient that decreases toward an interface between the insulating film 102 and the semiconductor film 106 and a gradient that decreases toward an interface between the semiconductor film 106 and the insulating film 112.

On the other hand, in FIG. 1C, the electron affinity of the semiconductor film 106 is constant between the insulating film 102 and the insulating film 112.

A state where a band diagram changes gradually between the insulating film 102 and the insulating film 112 as shown in FIG. 1B is referred to as continuous junction. On the other hand, a state where a band diagram is constant between the insulating film 102 and the insulating film 112 as shown in FIG. 1C is referred to as discontinuous junction.

In the case of employing the band diagram in FIG. 1B, the electrical characteristics of the transistor can be sometimes improved as compared to the case of employing the band diagram in FIG. 1C. For example, interface states due to junction of different kinds of materials, damage in deposition, entry of impurities, or the like are generated in some cases at the interface between the insulating film 102 and the semiconductor film 106 and the interface between the semiconductor film 106 and the insulating film 112.

With the band diagram in FIG. 1B, a path of electrons that are carriers (channel region) is apart from a region including the interface states. That is, the band diagram is not easily affected by the interface states; thus, in the transistor with the band diagram, a decrease in on-state current due to the interface states is less likely to occur. Thus, a transistor with a high on-state current and a low subthreshold swing value (also referred to as S value) is obtained. Furthermore, an electric field from the gate electrode is relatively small. Thus, the carrier density in a region near the interface between the insulating film 102 and the semiconductor film 106 decreases, so that leakage current generated in the region becomes small. In other words, the off-state current of the transistor can be reduced. In addition, when there is an energy difference between the region including the interface states and the channel region, carriers are not easily trapped in the interface states. Thus, variation in the electrical characteristics due to the interface states does not easily occur, so that a transistor with high reliability is obtained.

<Method for Manufacturing Transistor Having Continuous Conjunction>

A method for manufacturing a transistor having continuous conjunction is described below with reference to FIG. 1A.

First, the substrate 100 is prepared.

There is no large limitation on the substrate 100. For example, a glass substrate, a ceramic substrate, a quartz substrate, a sapphire substrate, or a stabilized zirconia substrate (e.g., an yttria-stabilized zirconia substrate) may be used. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used. Still alternatively, any of these substrates provided with a semiconductor element may be used.

Still alternatively, a flexible substrate may be used as the substrate 100. As a method for providing the transistor over a flexible substrate, there is a method in which the transistor is formed over a non-flexible substrate and then the transistor is separated and transferred to the substrate 100 which is a flexible substrate. In that case, a separation layer is preferably provided between the non-flexible substrate and the transistor.

Next, the insulating film 102 is formed.

The insulating film 102 may be formed of, for example, a single layer or a stack of an insulating film containing aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The insulating film 102 may be formed by a sputtering method, a chemical vapor deposition (CVD) method, a molecular beam epitaxy (MBE) method, a pulsed laser deposition (PLD) method, or an atomic layer deposition (ALD) method.

Note that in the case where the insulating film 102 is a stacked-layer film, films in the stacked-layer film may be formed using by different deposition methods such as the above deposition methods. For example, the first layer may be formed by a CVD method and the second layer may be formed by an ALD method. Alternatively, the first layer may be formed by a sputtering method and the second layer may be formed by an ALD method. When films are formed by different deposition methods as described above, the films can have different functions or different properties. Further, by stacking the films, a more appropriate film can be formed as a stacked-layer film.

In other words, an n-th film is formed by at least one of a sputtering method, a CVD method, an MBE method, a PLD method, an ALD method, and the like, and an n+1 film is formed by at least one of a sputtering method, a CVD method, an MBE method, a PLD method, an ALD method, and the like (n is a natural number). Note that the n-th film and the n+1 film may be formed by the same deposition method or different deposition methods. Note that the n-th film and the n+2 film may be formed by the same deposition method. Alternatively, all the films may be formed by the same deposition method.

Alternatively, when a silicon substrate is used as the substrate 100, the insulating film to be the insulating film 102 can be formed by a thermal oxidation method.

Then, in order to planarize the surface of the insulating film to be the insulating film 102, chemical mechanical polishing (CMP) may be performed. By CMP treatment, the average surface roughness (Ra) of the insulating film to be the insulating film 102 is less than or equal to 1 nm, preferably less than or equal to 0.3 nm, more preferably less than or equal to 0.1 nm. In some cases, Ra that is less than or equal to the above value can increase the crystallinity of the semiconductor film 106. Ra can be measured using an atomic force microscope (AFM).

Next, the semiconductor film 106 is formed.

As the semiconductor film 106, a semiconductor film containing an element belonging to Group 14, such as a silicon film or a germanium film, a compound semiconductor film, such as a silicon carbide film, a germanium silicide film, a gallium arsenide film, an indium phosphide film, a zinc selenide film, a cadmium sulfide film, and an oxide semiconductor film or an organic semiconductor film may be used. The semiconductor film 106 may have a single-layer structure or a stacked-layer structure. For example, the semiconductor film 106 may have a stacked-layer structure including a zinc oxide layer having a thickness of 0.1 atomic layers or more and 20 atomic layers or less and an oxide semiconductor film over the zinc oxide layer.

The oxide semiconductor film is preferably used as the semiconductor film 106. The specific examples of the oxide semiconductor film are described later.

The semiconductor film to be the semiconductor film 106 can be formed by a sputtering method, a CVD method, an MBE method, a PLD method, an ALD method, or the like.

In the case where the semiconductor film 106 is formed by etching the semiconductor film, it is preferable that etching be performed so that a surface to be processed of the semiconductor film 106 is not damaged. For example, neutral beam etching may be performed by a dry etching method. By using neutral beam, charge buildup due to charges does not occur, and the beam has low energy; thus, etching can be performed with less damage. Alternatively, in the case where the semiconductor film 106 is crystalline, a wet etching method may be used, which utilizes the fact that an etching rate varies depending on crystal planes. By using the wet etching method, damage to the surface to be processed can be reduced.

The semiconductor film 106 is, for example, a semiconductor film whose electron affinity is continuously changed. To change the electron affinity of the semiconductor film continuously, the composition or impurity concentration may be continuously changed, for example.

In the case where the semiconductor film 106 has a stacked-layer structure, as an example, a stacked film may be formed, for example, using a semiconductor film whose electron affinity is continuously changed and a semiconductor film whose electron affinity is not continuously changed. For example, it is possible to employ a three-layer structure in which the semiconductor film whose electron affinity is not continuously changed is sandwiched between the semiconductor films whose electron affinity is continuously changed or a three-layer structure in which the semiconductor film whose electron affinity is continuously changed is sandwiched between the semiconductor films whose electron affinity is not continuously changed.

By using a CVD method, for example, a semiconductor film to be the semiconductor film 106 whose composition is continuously changed can be formed.

The CVD method can include a plasma enhanced CVD (PECVD) method using plasma, a thermal CVD (TCVD) method using heat, and the like. Moreover, the CVD method can include a metal CVD (MCVD) method and a metal organic CVD (MOCVD) method depending on a source gas.

By using the PECVD method, a high-quality film can be formed at a relatively low temperature. By using the TCVD method, in which plasma is not used, a film can be formed with few defects because damage caused by plasma does not occur.

When the CVD method is used, composition of a film to be formed can be controlled with a flow rate ratio of the source gases. For example, by the MCVD method and the MOCVD method, a film with a certain composition can be formed depending on a flow rate ratio of the source gases. Moreover, with the MCVD method and the MOCVD method, by changing the flow rate ratio of the source gases while forming the film, a film whose composition is continuously changed can be formed. For example, the proportion of the source gas containing an element M (aluminum, gallium, yttrium, or tin) can be increased or decreased. In the case where the film is formed while changing the flow rate ratio of the source gases, as compared to the case where the film is formed using a plurality of deposition chambers, time taken for the film formation can be reduced because time taken for transfer and pressure adjustment is omitted. Thus, transistors can be manufactured with improved productivity. A specific example of a deposition apparatus that can be used for the MOCVD method is described later.

Alternatively, the film whose composition is continuously changed may be formed by a sputtering method, an MBE method, a PLD method, or an ALD method.

The insulating film 102 is in contact with the semiconductor film 106. Thus, it is preferable that a semiconductor film to be the semiconductor film 106 be formed by a deposition method that does not damage the insulating film 102. That is, the semiconductor film is preferably formed by the MOCVD method or the like, for example.

Note that in the case where the semiconductor film 106 is formed to have a stacked-layer structure, films in the semiconductor film 106 may be formed by different deposition methods such as a sputtering method, a CVD method (a plasma CVD method, a thermal CVD method, an MCVD method, an MOCVD method, or the like), an MBE method, a PLD method, and an ALD method. For example, the first layer may be formed by an MOCVD method and the second layer may be formed by a sputtering method. Alternatively, the first layer may be formed by an ALD method and the second layer may be formed by an MOCVD method. Alternatively, the first layer may be formed by an ALD method and the second layer may be formed by a sputtering method. Alternatively, the first layer may be formed by an ALD method, the second layer may be formed by a sputtering method, and the third layer may be formed by an ALD method. Thus, when films are formed by different deposition methods, the films can have different functions or different properties. Further, by stacking the films, a more appropriate film can be formed as a stacked-layer film.

In other words, in the case where the semiconductor film 106 is a stacked-layer film, for example, an n-th film is formed by at least one of a CVD method (a plasma CVD method, a thermal CVD method, an MCVD method, an MOCVD method, or the like), an MBE method, a PLD method, an ALD method, and the like and an n+1-th film is formed by at least one of a CVD method (a plasma CVD method, a thermal CVD method, an MCVD method, an MOCVD method, or the like), an MBE method, a PLD method, an ALD method, and the like (n is a natural number). Note that the n-th film and the n+1-th film may be formed by different deposition methods. Note that the n-th film and the n+2-th film may be formed by the same deposition method. Alternatively, all the films may be formed by the same deposition method.

Note that the semiconductor film 106 or at least one film in the stacked semiconductor film 106, and the insulating film 102 or at least one film in the stacked insulating film 102 may be formed by the same deposition method. For example, both of them may be formed by an ALD method. Thus, they can be formed without exposure to the air. As a result, entry of impurities can be prevented. Alternatively, for example, the insulating film 102 and the semiconductor film 106 in contact with each other may be formed by the same deposition method. Thus, the formation can be performed in the same chamber. As a result, entry of impurities can be prevented. As described above, the same deposition method may be employed in not only the case of the semiconductor film 106 and the insulating film 102 but also the case of other films which are adjacent to each other Note that a method for manufacturing a semiconductor device of one embodiment of the present invention is not limited thereto.

Next, the conductive film 116a and the conductive film 116b are formed.

The conductive film 116a and the conductive film 116b each may be formed to have a single-layer structure or a stacked-layer structure using a conductive film containing one or more kinds of aluminum, titanium, chromium, cobalt, nickel, copper, yttrium, zirconium, molybdenum, ruthenium, silver, tantalum, and tungsten, for example.

A conductive film to be the conductive film 116a and the conductive film 116b may be formed by a sputtering method, a CVD method, an MBE method, a PLD method, an ALD method, or the like.

The conductive film 116a and the conductive film 116b are formed in such a manner that the conductive film to be the conductive film 116a and the conductive film 116b is formed and then partly etched. Therefore, it is preferable to employ a deposition method by which the semiconductor film 106 is not damaged when the conductive film is formed. In other words, the conductive film is preferably formed by an MCVD method or the like.

Note that in the case where the conductive film 116a and the conductive film 116b are each formed to have a stacked-layer structure, films in the stacked-layer film may be formed by different deposition methods such as a CVD method (a plasma CVD method, a thermal CVD method, an MCVD method, an MOCVD method, or the like), an MBE method, a PLD method, and an ALD method. For example, the first layer may be formed by an MOCVD method and the second layer may be formed by a sputtering method. Alternatively, the first layer may be formed by an ALD method and the second layer may be formed by an MOCVD method. Alternatively, the first layer may be formed by an ALD method and the second layer may be formed by a sputtering method. Alternatively, the first layer may be formed by an ALD method, the second layer may be formed by a sputtering method, and the third layer may be formed by an ALD method. Thus, when films are formed by different deposition methods, the films can have different functions or different properties. Further, by stacking the films, a more appropriate film can be formed as a stacked-layer film.

In other words, in the case where the conductive film 116a and the conductive film 116b are each a stacked-layer film, for example, an n-th film is formed by at least one of a CVD method (a plasma CVD method, a thermal CVD method, an MCVD method, an MOCVD method, or the like), an MBE method, a PLD method, an ALD method, and the like and an n+1-th film is formed by at least one of a CVD method (a plasma CVD method, a thermal CVD method, an MCVD method, an MOCVD method, or the like), an MBE method, a PLD method, an ALD method, and the like (n is a natural number). Note that the n-th film and the n+1-th film may be formed by different deposition methods. Note that the n-th film and the n+2-th film may be formed by the same deposition method. Alternatively, all the films may be formed by the same deposition method.

Note that the conductive film 116a (conductive film 116b) or at least one film in the stacked conductive film 116a (conductive film 116b), and the semiconductor film 106 or at least one film in the stacked semiconductor film 106 may be formed by the same deposition method. For example, both of them may be formed by an ALD method. Thus, they can be formed without exposure to the air. As a result, entry of impurities can be prevented. Alternatively, for example, the conductive film 116a (conductive film 116b) and the semiconductor film 106 in contact with each other may be formed by the same deposition method. Thus, the formation can be performed in the same chamber. As a result, entry of impurities can be prevented. As described above, the same deposition method may be employed in not only the case of the semiconductor film 106 and the conductive film 116a (conductive film 116b) but also the case of other films which are adjacent to each other. Note that a method for manufacturing a semiconductor device of one embodiment of the present invention is not limited thereto.

Note that the conductive film 116*a* (conductive film 116*b*) or at least one film in the stacked conductive film 116*a* (conductive film 116*b*), the semiconductor film 106 or at least one film in the stacked semiconductor film 106, and the insulating film 102 or at least one film in the stacked insulating film 102 may be formed by the same deposition method. For example, all of them may be formed by an ALD method. Thus, they can be formed without exposure to the air. As a result, entry of impurities can be prevented. Note that a method for manufacturing a semiconductor device of one embodiment of the present invention is not limited thereto.

Next, the insulating film 112 is formed.

The insulating film 112 may be formed of, for example, a single layer or a stack of an insulating film containing aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The insulating film 112 may be formed by a sputtering method, a CVD method, an MBE method, a PLD method, an ALD method, or the like.

Note that in the case where the insulating film 112 is formed to have a stacked-layer structure, films in the insulating film 112 may be formed by different deposition methods such as a CVD method (a plasma CVD method, a thermal CVD method, an MCVD method, an MOCVD method, or the like), an MBE method, a PLD method, and an ALD method. For example, the first layer may be formed by an MOCVD method and the second layer may be formed by a sputtering method. Alternatively, the first layer may be formed by an ALD method and the second layer may be formed by an MOCVD method. Alternatively, the first layer may be formed by an ALD method and the second layer may be formed by a sputtering method. Alternatively, the first layer may be formed by an ALD method, the second layer may be formed by a sputtering method, and the third layer may be formed by an ALD method. Thus, when films are formed by different deposition methods, the films can have different functions or different properties. Further, by stacking the films, a more appropriate film can be formed as a stacked-layer film.

In other words, in the case where the insulating film 112 is a stacked-layer film, for example, an n-th film is formed by at least one of a CVD method (a plasma CVD method, a thermal CVD method, an MCVD method, an MOCVD method, or the like), an MBE method, a PLD method, an ALD method, and the like and an n+1-th film is formed by at least one of a CVD method (a plasma CVD method, a thermal CVD method, an MCVD method, an MOCVD method, or the like), an MBE method, a PLD method, an ALD method, and the like (n is a natural number). Note that the n-th film and the n+1-th film may be formed by different deposition methods. Note that the n-th film and the n+2-th film may be formed by the same deposition method. Alternatively, all the films may be formed by the same deposition method.

Note that the insulating film 112 or at least one film in the stacked insulating film 112, and the conductive film 116*a* (conductive film 116*b*) or at least one film in the stacked conductive film 116*a* (conductive film 116*b*) may be formed by the same deposition method. For example, both of them may be formed by an ALD method. Thus, they can be formed without exposure to the air. As a result, entry of impurities can be prevented. Alternatively, for example, the conductive film 116*a* (conductive film 116*b*) and the insulating film 112 in contact with each other may be formed by the same deposition method. Thus, the formation can be performed in the same chamber. As a result, entry of impurities can be prevented.

Note that the insulating film 112 or at least one film in the stacked insulating film 112, the conductive film 116*a* (conductive film 116*b*) or at least one film in the stacked conductive film 116*a* (conductive film 116*b*), the semiconductor film 106 or at least one film in the stacked semiconductor film 106, and the insulating film 102 or at least one film in the stacked insulating film 102 may be formed by the same deposition method. For example, all of them may be formed by an ALD method. Thus, they can be formed without exposure to the air. As a result, entry of impurities can be prevented. Note that a method for manufacturing a semiconductor device of one embodiment of the present invention is not limited thereto.

Then, the conductive film 104 is formed.

The conductive film 104 may be formed to have a single-layer structure or a stacked-layer structure using a conductive film containing one or more kinds of aluminum, titanium, chromium, cobalt, nickel, copper, yttrium, zirconium, molybdenum, ruthenium, silver, tantalum, and tungsten, for example.

A conductive film to be the conductive film 104 may be formed by a sputtering method, a CVD method, an MBE method, a PLD method, an ALD method, or the like.

The insulating film 112 functions as a gate insulating film of a transistor. Therefore, the conductive film 104 is preferably formed by a deposition method by which the insulating film 112 is not damaged when the conductive film to be the conductive film 104 is formed. In other words, the conductive film is preferably formed by an MCVD method or the like.

Note that in the case where the conductive film 104 is formed to have a stacked-layer structure, films in the conductive film 104 may be formed by different deposition methods such as a CVD method (a plasma CVD method, a thermal CVD method, an MCVD method, an MOCVD method, or the like), an MBE method, a PLD method, and an ALD method. For example, the first layer may be formed by an MOCVD method and the second layer may be formed by a sputtering method. Alternatively, the first layer may be formed by an ALD method and the second layer may be formed by an MOCVD method. Alternatively, the first layer may be formed by an ALD method and the second layer may be formed by a sputtering method. Alternatively, the first layer may be formed by an ALD method, the second layer may be formed by a sputtering method, and the third layer may be formed by an ALD method. Thus, when films are formed by different deposition methods, the films can have different functions or different properties. Further, by stacking the films, a more appropriate film can be formed as a stacked-layer film.

In other words, in the case where the conductive film 104 is a stacked-layer film, for example, an n-th film is formed by at least one of a CVD method (a plasma CVD method, a thermal CVD method, an MCVD method, an MOCVD method, or the like), an MBE method, a PLD method, an ALD method, and the like and an n+1-th film is formed by at least one of a CVD method (a plasma CVD method, a thermal CVD method, an MCVD method, an MOCVD method, or the like), an MBE method, a PLD method, an ALD method, and the like (n is a natural number). Note that the n-th film and the n+1-th film may be formed by different deposition methods. Note that the n-th film and the n+2-th film may be formed by the same deposition method. Alternatively, all the films may be formed by the same deposition method.

Note that the conductive film 104 or at least one film in the stacked conductive film 104, and the insulating film 112 or at least one film in the stacked insulating film 112 may be formed by the same deposition method. For example, both of them may be formed by an ALD method. Thus, they can be formed without exposure to the air. As a result, entry of impurities can be prevented. Alternatively, for example, the conductive film 104 and the insulating film 112 in contact with each other may be formed by the same deposition method. Thus, the formation can be performed in the same chamber. As a result, entry of impurities can be prevented.

Note that the conductive film 104 or at least one film in the stacked conductive film 104, the insulating film 112 or at least one film in the stacked insulating film 112, the conductive film 116a (conductive film 116b) or at least one film in the stacked conductive film 116a (conductive film 116b), the semiconductor film 106 or at least one film in the stacked semiconductor film 106, and the insulating film 102 or at least one film in the stacked insulating film 102 may be formed by the same deposition method. For example, all of them may be formed by an ALD method. Thus, they can be formed without exposure to the air. As a result, entry of impurities can be prevented. Note that a method for manufacturing a semiconductor device of one embodiment of the present invention is not limited thereto.

In this manner, a transistor of one embodiment of the present invention can be manufactured.

<Other Examples of Transistor>

As described above, by forming a film while changing composition or the like continuously, a band diagram of a semiconductor film or the like can be controlled appropriately. Examples of transistors each having a band diagram that is different from the band diagrams in FIGS. 1B and 1C are described below with reference to FIGS. 2A to 2C, FIGS. 3A to 3C, FIGS. 4A to 4C, and FIGS. 5A and 5B. Note that the band diagrams in FIGS. 2A to 2C, FIGS. 3A to 3C, and FIGS. 4A to 4C each correspond to the dashed-dotted line L1-L2 of the transistor in FIG. 1A.

Figure 2A:
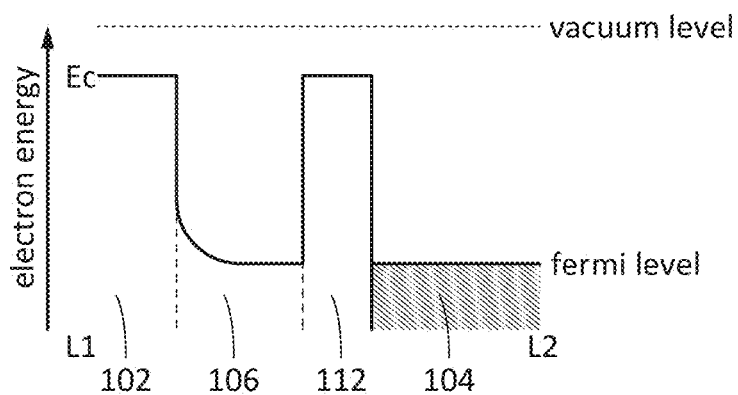
FIGS. 2A to 2C show band diagrams of a transistor of one embodiment of the present invention.

In FIG. 2A, the electron affinity of the semiconductor film 106 changes continuously between the insulating film 102 and the insulating film 112. Specifically, the electron affinity of the semiconductor film 106 includes a gradient that decreases toward the interface between the insulating film 102 and the semiconductor film 106. The electron affinity has a discontinuous point at the interface between the semiconductor film 106 and the insulating film 112.

Thus, in the case of employing the band diagram in FIG. 2A, the electrical characteristics of the transistor can be sometimes improved as compared to the case of employing the band diagram in FIG. 1C. For example, interface states due to junction of different kinds of materials, damage in deposition, entry of impurities, or the like are generated in some cases at the interface between the insulating film 102 and the semiconductor film 106.

With the band diagram in FIG. 2A, a channel region is apart from a region including the interface states. That is, the band diagram is not easily affected by the interface states; thus, in the transistor with the band diagram, a decrease in on-state current due to the interface states is less likely to occur. Thus, a transistor with high on-state current and a low S value is obtained. Furthermore, an electric field from the gate electrode is relatively small. Thus, the carrier density in a region near the interface between the insulating film 102 and the semiconductor film 106 decreases, so that leakage current generated in the region becomes small. In other words, the off-state current of the transistor can be reduced. In addition, when there is an energy difference between the region including the interface states and the channel region, carriers are not easily trapped in the interface states. Thus, variation in the electrical characteristics due to the interface states does not easily occur, so that a transistor with high reliability is obtained.

Figure 2B:
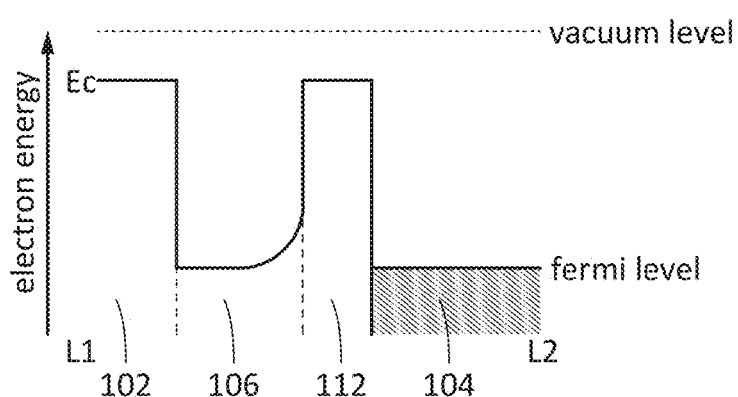

In FIG. 2B, the electron affinity of the semiconductor film 106 changes continuously between the insulating film 102 and the insulating film 112. Specifically, the electron affinity of the semiconductor film 106 includes a gradient that decreases toward the interface between the semiconductor film 106 and the insulating film 112. The electron affinity has a discontinuous point at the interface between the insulating film 102 and the semiconductor film 106.

Thus, in the case of employing the band diagram in FIG. 2B, the electrical characteristics of the transistor can be sometimes improved as compared to the case of employing the band diagram in FIG. 1C. For example, interface states due to junction of different kinds of materials, damage in deposition, entry of impurities, or the like are generated in some cases at the interface between the semiconductor film 106 and the insulating film 112.

With the band diagram in FIG. 2B, a channel region is apart from a region including the interface states. That is, the band diagram is not easily affected by the interface states; thus, in the transistor with the band diagram, a decrease in on-state current due to the interface states is less likely to occur. Thus, a transistor with high on-state current and a low S value is obtained. In addition, when there is an energy difference between the region including the interface states and the channel region, carriers are not easily trapped in the interface states. Thus, variation in the electrical characteristics due to the interface states does not easily occur, so that a transistor with high reliability is obtained.

Figure 2C:
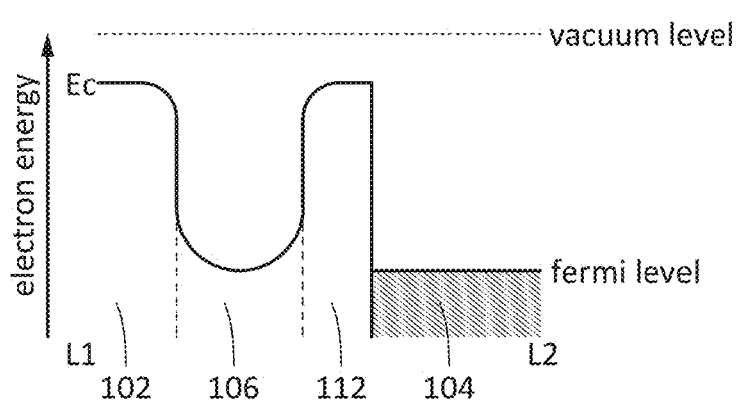

In FIG. 2C, the electron affinity of the semiconductor film 106 changes continuously between the insulating film 102 and the insulating film 112. Specifically, the electron affinity of the semiconductor film 106 has continuous junction with a gradient that decreases toward the interface between the insulating film 102 and the semiconductor film 106 and a gradient that decreases toward the interface between the semiconductor film 106 and the insulating film 112. Moreover, the electron affinity of each of the insulating films 102 and 112 has continuous junction with a gradient that increases toward the semiconductor film 106.

Thus, in the case of employing the band diagram in FIG. 2C, the electrical characteristics of the transistor can be sometimes improved as compared to the case of employing the band diagram in FIG. 1C. For example, interface states due to junction of different kinds of materials, damage in deposition, entry of impurities, or the like are generated in some cases at the interface between the insulating film 102 and the semiconductor film 106 and the interface between the semiconductor film 106 and the insulating film 112.

With the band diagram in FIG. 2C, junction states at the interfaces are favorable; thus, interface state density can be reduced. In addition, a channel region is apart from a region including the interface states. That is, the band diagram is not easily affected by the interface states because of the low interface state density; thus, in the transistor with the band diagram, a decrease in on-state current due to the interface states is less likely to occur. Thus, a transistor with high on-state current and a low S value is obtained. Furthermore, an electric field from the gate electrode is relatively small. Thus, the carrier density in a region near the interface between the insulating film 102 and the semiconductor film 106 decreases, so that leakage current generated in the region becomes small. In other words, the off-state current of the transistor can be reduced. In addition, when there is an energy difference between the region including the interface states and the channel region, carriers are not easily trapped in the interface states. Thus, variation in the electrical characteristics due to the interface states does not easily occur, so that a transistor with high reliability is obtained.

Figure 3A:
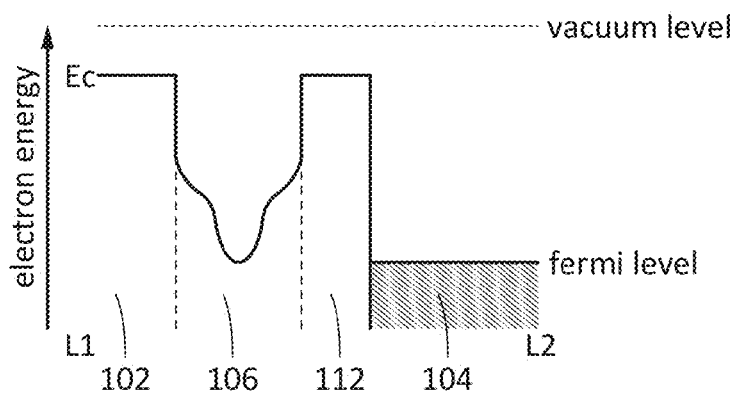
FIGS. 3A to 3C show band diagrams of a transistor of one embodiment of the present invention.

In FIG. 3A, the electron affinity of the semiconductor film 106 changes continuously between the insulating film 102 and the insulating film 112. Specifically, the electron affinity of the semiconductor film 106 has continuous junction with a gradient that decreases toward the interface between the insulating film 102 and the semiconductor film 106, a gradient that decreases toward the interface between the semiconductor film 106 and the insulating film 112, and a gradient that increases toward the middle of the semiconductor film 106.

Thus, in the case of employing the band diagram in FIG. 3A, the electrical characteristics of the transistor can be sometimes improved as compared to the case of employing the band diagram in FIG. 1C. For example, interface states due to junction of different kinds of materials, damage in deposition, entry of impurities, or the like are generated in some cases at the interface between the insulating film 102 and the semiconductor film 106 and the interface between the semiconductor film 106 and the insulating film 112.

With the band diagram in FIG. 3A, a channel region is further apart from a region including the interface states. That is, the band diagram in particular is not easily affected by the interface states; thus, in the transistor with the band diagram, a decrease in on-state current due to the interface states is less likely to occur particularly. Thus, a transistor with high on-state current and a low S value is obtained. Furthermore, an electric field from the gate electrode is relatively small. Thus, the carrier density in a region near the interface between the insulating film 102 and the semiconductor film 106 decreases, so that leakage current generated in the region becomes small. In other words, the off-state current of the transistor can be reduced. In addition, when there is an energy difference between the region including the interface states and the channel region, carriers are not easily trapped in the interface states. Thus, variation in the electrical characteristics due to the interface states does not easily occur, so that a transistor with high reliability is obtained.

Figure 3B:
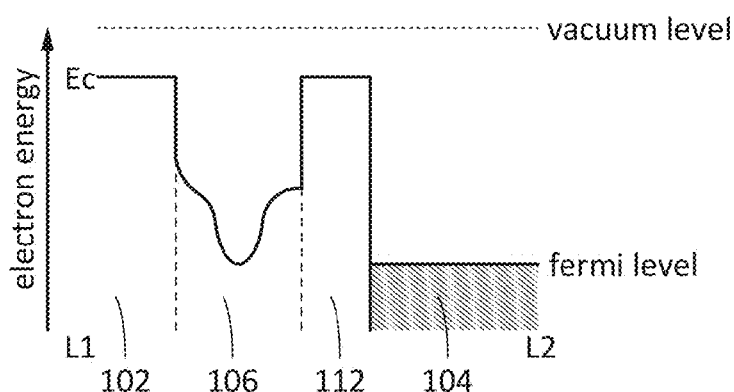

In FIG. 3B, the electron affinity of the semiconductor film 106 changes continuously between the insulating film 102 and the insulating film 112. Specifically, the electron affinity of the semiconductor film 106 includes a gradient that decreases toward the interface between the insulating film 102 and the semiconductor film 106 and a gradient that increases toward the middle of the semiconductor film 106. The electron affinity has a discontinuous point at the interface between the semiconductor film 106 and the insulating film 112.

Thus, in the case of employing the band diagram in FIG. 3B, the electrical characteristics of the transistor can be sometimes improved as compared to the case of employing the band diagram in FIG. 1C. For example, interface states due to junction of different kinds of materials, damage in deposition, entry of impurities, or the like are generated in some cases at the interface between the insulating film 102 and the semiconductor film 106 and the interface between the semiconductor film 106 and the insulating film 112.

With the band diagram in FIG. 3B, a channel region is further apart from a region including the interface states. That is, the band diagram in particular is not easily affected by the interface states; thus, in the transistor with the band diagram, a decrease in on-state current due to the interface states is less likely to occur. Thus, a transistor with high on-state current and a low S value is obtained. Furthermore, an electric field from the gate electrode is relatively small. Thus, the carrier density in a region near the interface between the insulating film 102 and the semiconductor film 106 decreases, so that leakage current generated in the region becomes small. In other words, the off-state current of the transistor can be reduced. In addition, when there is an energy difference between the region including the interface states and the channel region, carriers are not easily trapped in the interface states. Thus, variation in the electrical characteristics due to the interface states does not easily occur, so that a transistor with high reliability is obtained.

Figure 3C:
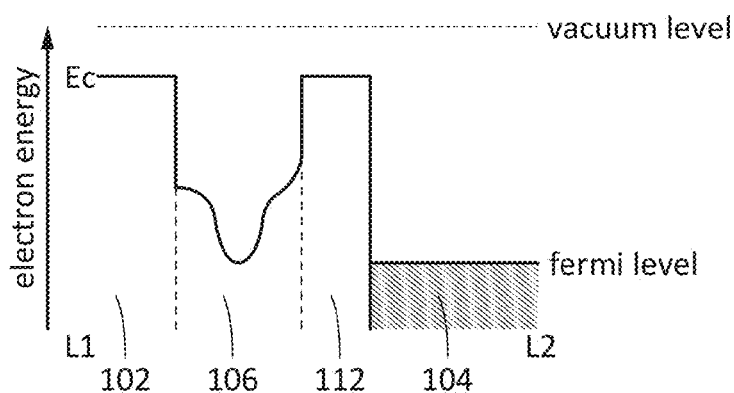

In FIG. 3C, the electron affinity of the semiconductor film 106 changes continuously between the insulating film 102 and the insulating film 112. Specifically, the electron affinity of the semiconductor film 106 includes a gradient that increases toward the middle of the semiconductor film 106 and a gradient that decreases toward the interface between the semiconductor film 106 and the insulating film 112. The electron affinity has a discontinuous point at the interface between the insulating film 102 and the semiconductor film 106.

Thus, in the case of employing the band diagram in FIG. 3C, the electrical characteristics of the transistor can be sometimes improved as compared to the case of employing the band diagram in FIG. 1C. For example, interface states due to junction of different kinds of materials, damage in deposition, entry of impurities, or the like are generated in some cases at the interface between the insulating film 102 and the semiconductor film 106 and the interface between the semiconductor film 106 and the insulating film 112.

With the band diagram in FIG. 3C, a channel region is further apart from a region including the interface states. That is, the band diagram in particular is not easily affected by the interface states because of the low interface state density; thus, in the transistor with the band diagram, a decrease in on-state current due to the interface states is less likely to occur. Thus, a transistor with high on-state current and a low S value is obtained. Furthermore, an electric field from the gate electrode is relatively small. Thus, the carrier density in a region near the interface between the insulating film 102 and the semiconductor film 106 decreases, so that leakage current generated in the region becomes small. In other words, the off-state current of the transistor can be reduced. In addition, when there is an energy difference between the region including the interface states and the channel region, carriers are not easily trapped in the interface states. Thus, variation in the electrical characteristics due to the interface states does not easily occur, so that a transistor with high reliability is obtained.

Figure 4A:
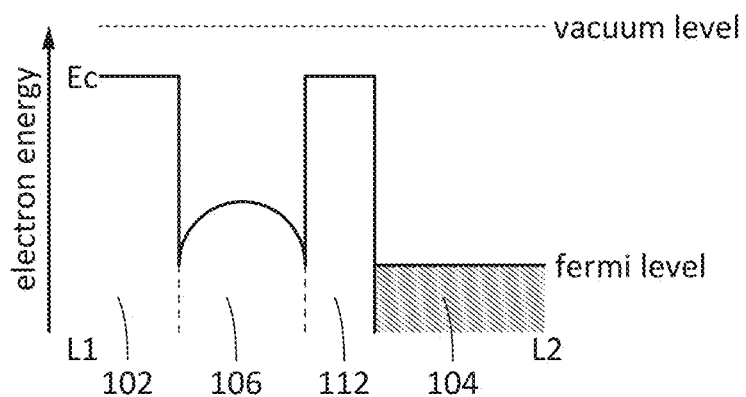
FIGS. 4A to 4C show band diagrams of a transistor of one embodiment of the present invention.

In FIG. 4A, the electron affinity of the semiconductor film 106 changes continuously between the insulating film 102 and the insulating film 112. Specifically, the electron affinity of the semiconductor film 106 includes a gradient that increases toward the interface between the insulating film 102 and the semiconductor film 106 and a gradient that increases toward the interface between the semiconductor film 106 and the insulating film 112. The electron affinity has a discontinuous point at the interface between the insulating film 102 and the semiconductor film 106. In addition, the electron affinity has a discontinuous point at the interface between the semiconductor film 106 and the insulating film 112.

Thus, in the case of employing the band diagram in FIG. 4A, the electrical characteristics of the transistor can be sometimes improved as compared to the case of employing the band diagram in FIG. 1C. For example, when the electron affinity at the interface between the semiconductor film 106 and the insulating film 112 is high, the semiconductor film 106 is easily affected by an electric field from the gate electrode. Moreover, for example, when the electron affinity at the interface between the insulating film 102 and the semiconductor film 106 is high, the transistor can be turned on at a low gate voltage.

With the band diagram in FIG. 4A, the transistor with a fast on/off switching speed is obtained. Thus, the transistor with a low S value is obtained. Moreover, high on-state current can be obtained at a low gate voltage. In other words, the transistor with low power consumption can be obtained.

Figure 4B:
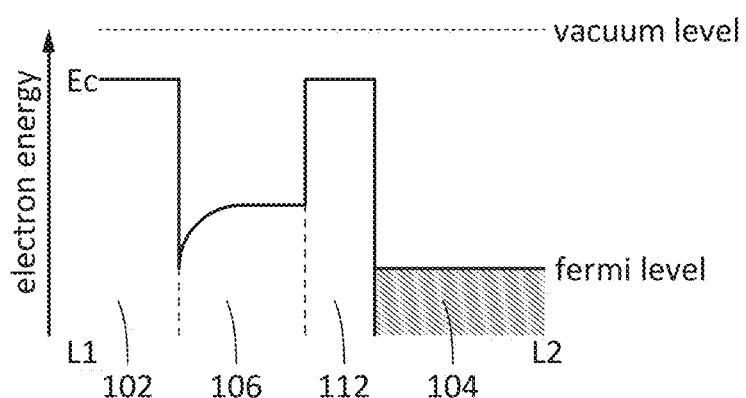

In FIG. 4B, the electron affinity of the semiconductor film 106 changes continuously between the insulating film 102 and the insulating film 112. Specifically, the electron affinity of the semiconductor film 106 includes a gradient that increases toward the interface between the insulating film 102 and the semiconductor film 106. The electron affinity has a discontinuous point at the interface between the insulating film 102 and the semiconductor film 106. In addition, the electron affinity has a discontinuous point at the interface between the semiconductor film 106 and the insulating film 112.

Thus, in the case of employing the band diagram in FIG. 4B, the electrical characteristics of the transistor can be sometimes improved as compared to the case of employing the band diagram in FIG. 1C. For example, when the electron affinity at the interface between the insulating film 102 and the semiconductor film 106 is high, the transistor can be turned on at a low gate voltage.

With the band diagram in FIG. 4B, high on-state current can be obtained at a low gate voltage. In other words, the transistor with low power consumption can be obtained.

Figure 4C:
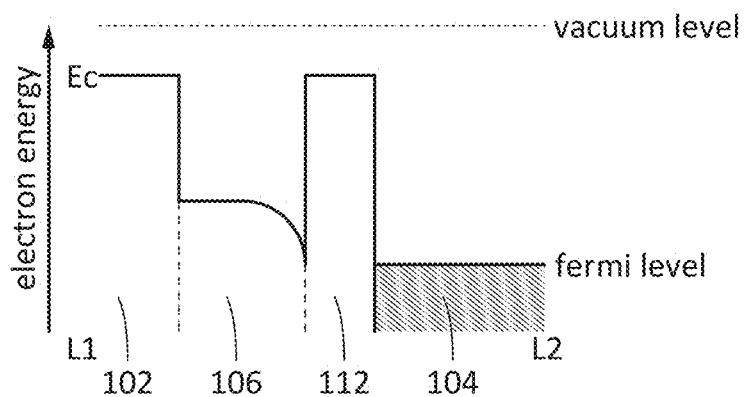

In FIG. 4C, the electron affinity of the semiconductor film 106 changes continuously between the insulating film 102 and the insulating film 112. Specifically, the electron affinity of the semiconductor film 106 includes a gradient that increases toward the interface between the semiconductor film 106 and the insulating film 112. The electron affinity has a discontinuous point at the interface between the insulating film 102 and the semiconductor film 106. In addition, the electron affinity has a discontinuous point at the interface between the semiconductor film 106 and the insulating film 112.

Thus, in the case of employing the band diagram in FIG. 4C, the electrical characteristics of the transistor can be sometimes improved as compared to the case of employing the band diagram in FIG. 1C. For example, when the electron affinity at the interface between the semiconductor film 106 and the insulating film 112 is high, the semiconductor film 106 is easily affected by an electric field from the gate electrode.

With the band diagram in FIG. 4C, the transistor with a fast on/off switching speed is obtained. Thus, the transistor with a low S value is obtained.

Figure 5A:
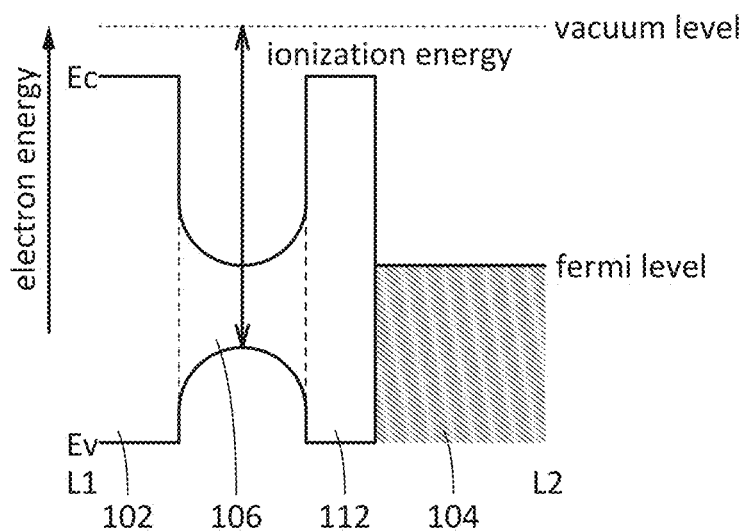
FIGS. 5A and 5B show band diagrams of a transistor of one embodiment of the present invention.
Figure 5B:
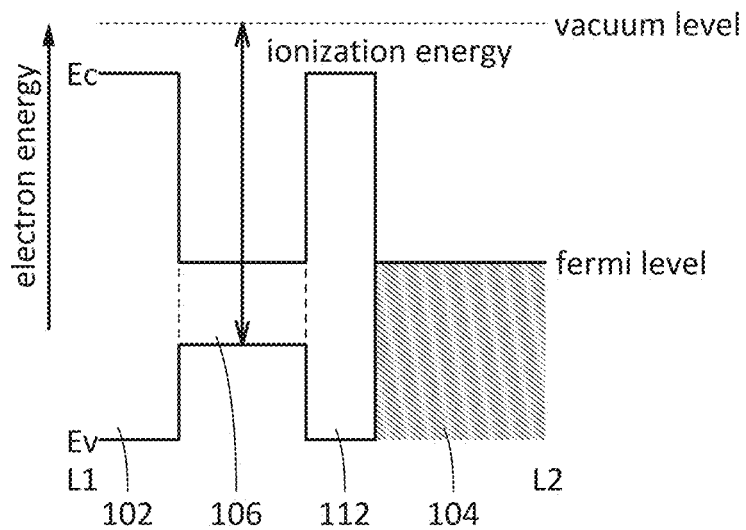

FIGS. 5A and 5B each illustrate a band diagram taken along the dashed-dotted line L1-L2 in FIG. 1A. In the band diagram, in addition to the above components, the energy (Ev) at the top of the valence band of each of the insulating film 102, the semiconductor film 106, and the insulating film 112 is shown. An energy difference between a vacuum level and the top of the valence band is referred to as ionization energy.

In FIG. 5A, the ionization energy of the semiconductor film 106 changes continuously between the insulating film 102 and the insulating film 112. Specifically, the ionization energy of the semiconductor film 106 has an inverted U-like shape including a gradient that increases toward the interface between the insulating film 102 and the semiconductor film 106 and a gradient that increases toward the interface between the semiconductor film 106 and the insulating film 112.

On the other hand, in FIG. 5B, the ionization energy of the semiconductor film 106 is constant between the insulating film 102 and the insulating film 112.

In the case of employing the band diagram in FIG. 5A, the electrical characteristics of the transistor can be sometimes improved as compared to the case of employing the band diagram in FIG. 5B. For example, interface states due to junction of different kinds of materials, damage in deposition, entry of impurities, or the like are generated in some cases at the interface between the insulating film 102 and the semiconductor film 106 and the interface between the semiconductor film 106 and the insulating film 112.

With the band diagram in FIG. 5A, holes are apart from a region including the interface states even when holes are generated; thus, the holes are not easily trapped in the interface states. That is, the band diagram is not easily affected by the interface states; thus, in the transistor with the band diagram, a decrease in on-state current due to the interface states is less likely to occur. Thus, variation in the electrical characteristics due to the interface states does not occur easily, so that a transistor with high reliability is obtained.

Alternatively, for example, a hole-trapped center is included in the insulating film 102 and/or the insulating film 112 in some cases. With the band diagram in FIG. 5B, for example, when holes are generated by light entering a semiconductor film, the holes move to the hole-trapped center in the insulating film 102 and/or the insulating film 112 through a level in the semiconductor film 106 when a voltage is applied to the gate electrode. The holes trapped in the hole-trapped center in the insulating film 102 and/or the insulating film 112 are not easily released and thus behave like a fixed charge in some cases.

On the other hand, with the band diagram in FIG. 5A, the level in the semiconductor film 106 is apart from the hole-trapped center in the insulating film 102 and/or the insulating film 112. Thus, even when the holes are generated by light entering the semiconductor film, the holes do not easily move to the hole-trapped center in the insulating film 102 and/or the insulating film 112 through the level in the semiconductor film 106. As a result, even in the case where the hole-trapped center is included in the insulating film 102 and/or the insulating film 112, variation in the electrical characteristics does not easily occur, and a transistor with high reliability is obtained.

As described above, the band diagram of the semiconductor film or the like is controlled appropriately, whereby the transistor having excellent electrical characteristics can be obtained.

Note that the above band diagrams of the semiconductor film and the like are examples. For example, one embodiment of the present invention includes a transistor having a band diagram formed by combining part or the whole of the above band diagrams.

<Deposition Apparatus>

A specific example of a deposition apparatus that can form the semiconductor film of one embodiment of the present invention is described below.

Figure 6A:
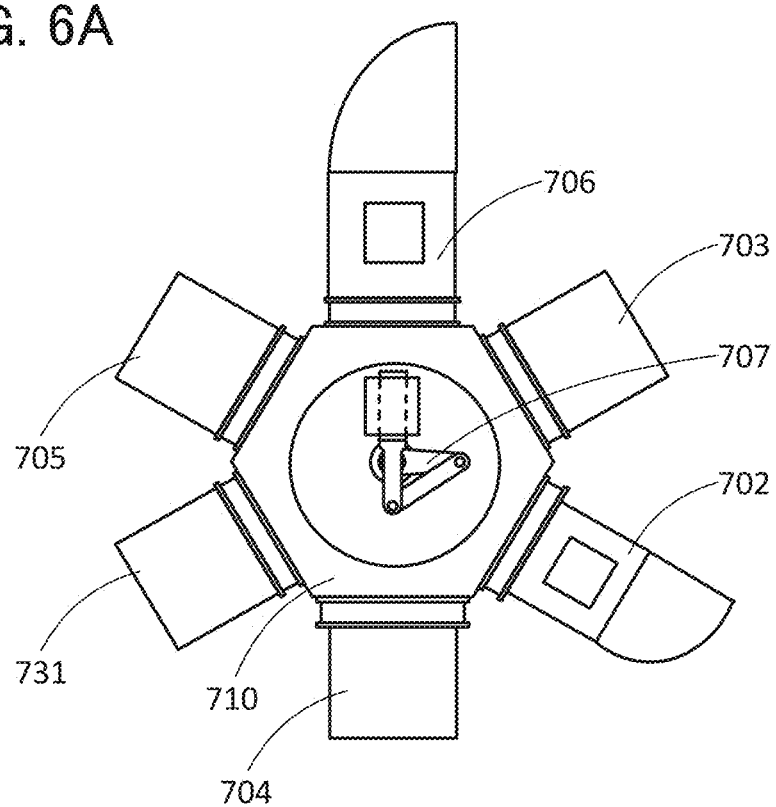
FIGS. 6A and 6B illustrate a deposition apparatus of one embodiment of the present invention.

A manufacturing apparatus illustrated in FIG. 6A includes at least a load chamber 702, a transfer chamber 710, a pretreatment chamber 703, a treatment chamber 731 which is a deposition chamber using a thermal CVD method, and an unload chamber 706. In the manufacturing apparatus illustrated in FIG. 6A, a film can be successively formed without exposure to the air. Thus, in the case where a stacked film is formed, entry of impurities into the film and the interface of the film can be prevented. Note that in order to prevent attachment of moisture to the inner wall of the chambers, the chambers of the manufacturing apparatus (including the load chamber, the treatment chamber, the transfer chamber, the deposition chamber, the unload chamber, and the like) are preferably filled with an inert gas (such as a nitrogen gas and a rare gas) whose dew point is lower than −60° C., preferably lower than −80° C., more preferably lower than −100° C. Alternatively, these chambers are set to a reduced pressure state in which the pressure is less than 1 Pa, preferably less than 0.1 Pa, more preferably less than $1 \times 10^{-4}$ Pa.

Furthermore, a treatment chamber 704 and/or a treatment chamber 705 may be a deposition chamber using a thermal CVD method (also referred to as a thermal CVD apparatus) that is similar to the treatment chamber 731.

For example, a semiconductor film may be formed in the treatment chamber 731, an insulating film may be formed in the treatment chamber 704, and a metal film may be formed in the treatment chamber 705. In this case, a stacked film of these films can be successively formed without exposure to the air.

First, a substrate 720 is transferred to the load chamber 702. Next, the substrate is transferred to the pretreatment chamber 703 by a transfer unit 707 of the transfer chamber 710. In the pretreatment chamber 703, treatment for cleaning the surface of the substrate or heat treatment are performed. Then, the substrate is transferred to the treatment chamber 731 and a semiconductor film is formed. By performing the treatment in the pretreatment chamber 703, the surface of the substrate can be clean. In addition, from the treatment on the surface of the substrate to the deposition of the semiconductor film, the substrate is not exposed to the air; thus, attachment of impurities and the like to the surface of the substrate can be inhibited.

Next, the substrate is transferred to the treatment chamber 704 by the transfer unit 707, and an insulating film such as a hafnium oxide film is formed. Then, the substrate is transferred to the treatment chamber 705 by the transfer unit 707, and a metal film such as a tungsten film is formed. Then, the substrate is transferred to the unload chamber 706 by the transfer unit 707. Through the above procedure, the semiconductor film, the insulating film, and the metal film can be sequentially stacked.

Figure 6B:
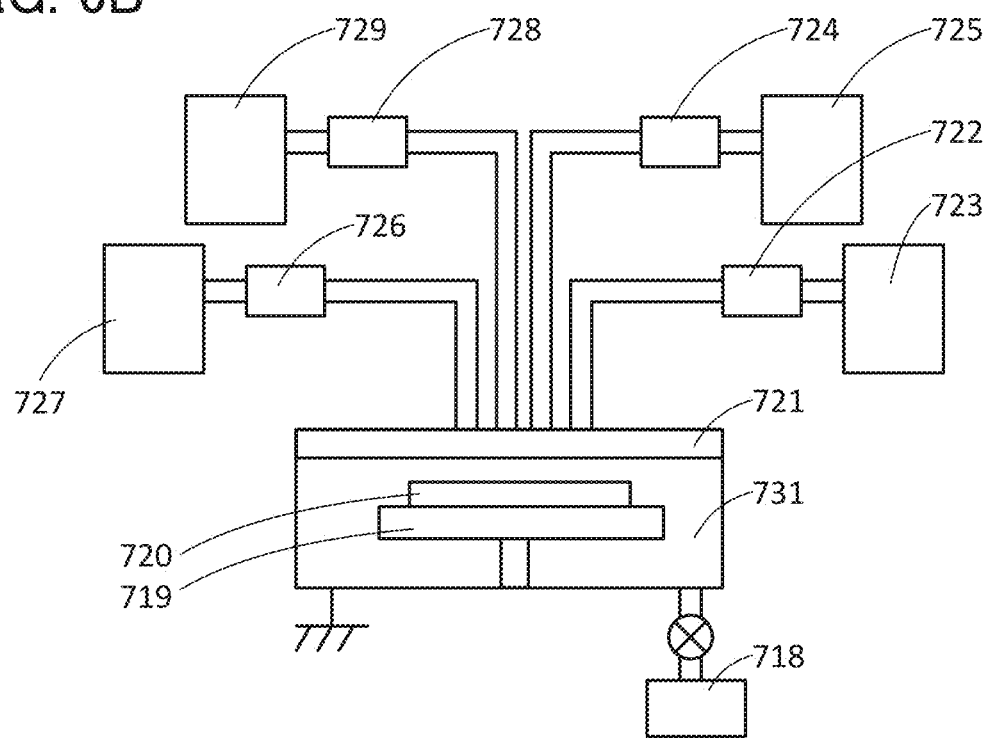

FIG. 6B shows an example of the thermal CVD apparatus. In the thermal CVD apparatus, the film is formed in the following manner: a source gas (one or more kinds), an oxidizer (such as $O_2$ and $O_3$), and the like are supplied at the same time to the chamber to which the substrate is transferred; reaction is performed near the substrate or on the surface of the substrate; and reaction products are deposited.

The treatment chamber 731, which is a thermal CVD apparatus, includes at least a substrate holder 719, a member 721 to which introduction ports for the plurality of source gases are connected, and an evacuation unit 718. Source gas introduction ports are each connected to a source material supply portion (a source material supply portion 723, a source material supply portion 725, a source material supply portion 727, or a source material supply portion 729) through a supply tube, a pressure controller, a valve, a flow rate controller (a flow rate controller 722, a flow rate controller 724, a flow rate controller 726, or a flow rate controller 728). A source gas exhaust port is connected to the evacuation unit 718 through an exhaust tube, a valve, and a pressure controller.

The treatment chamber 731 at the time of deposition may be in an atmospheric pressure state or a reduced pressure state.

The source gas may be supplied from a plurality of openings like a shower head.

In order to make the film thickness in a substrate plane uniform, the substrate holder 719 may be rotated to rotate the substrate 720 fixed to the substrate holder 719.

Note that since plasma is not used in the thermal CVD method, defects due to plasma are not generated in the film.

By the thermal CVD method, a variety of films such as a metal film, a semiconductor film, an insulating film, and the like can be formed. For example, in the case where an In—Ga—Zn oxide film is formed, as source gases, trimethylindium (($CH_3$)$_3$In), trimethylgallium (($CH_3$)$_3$Ga), and diethylzinc (($CH_3$)$_2$Zn) are used. However, the source gas of the In—Ga—Zn oxide film is not limited to this combination. For example, triethylgallium (($C_2H_5$)$_3$Ga) can be used instead of trimethylgallium and dimethylzinc (($C_2H_5$)$_2$Zn) can be used instead of diethylzinc.

Although FIG. 6A shows an example of a multi-chamber manufacturing apparatus in which a top surface shape of the transfer chamber 710 is a hexagon, a manufacturing apparatus in which the top surface shape is a polygon having more than six corners (such as a heptagon and an octagon) and more chambers are connected may be used. Alternatively, a multi-chamber manufacturing apparatus in which a top surface shape of the transfer chamber 710 is a pentagon or a tetragon may be used. Alternatively, an in-line manufacturing apparatus in which the transfer chamber is omitted by connecting a plurality of chambers to each other may be used. The in-line manufacturing apparatus has high productivity because there is no transfer chamber and the transfer time can be shortened. Although FIG. 6A shows an example of the single wafer manufacturing apparatus, a batch-type deposition apparatus in which films are deposited over a plurality of substrates at a time may be used. In addition, a mechanism for cleaning (such as plasma cleaning) may be included in each treatment chamber.

Although FIG. 6A shows an example in which a thermal CVD apparatus is used as each of the treatment chamber 704, the treatment chamber 705, and the treatment chamber 731, another deposition apparatus such as a sputtering apparatus or an ALD apparatus may be used in any one of these treatment chambers.

<Transistor Structure>

The structures of transistors of embodiments of the present invention will be described below.

<Transistor Structure 1>

Figure 7A:
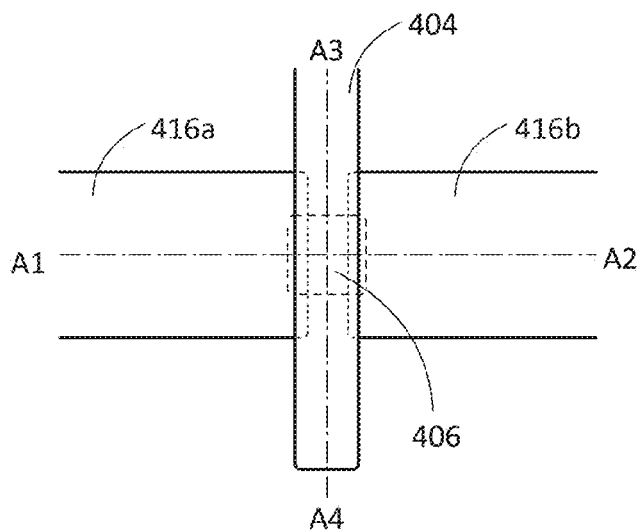
FIGS. 7A and 7B are a top view and a cross-sectional view illustrating a transistor of one embodiment of the present invention.
Figure 7B:
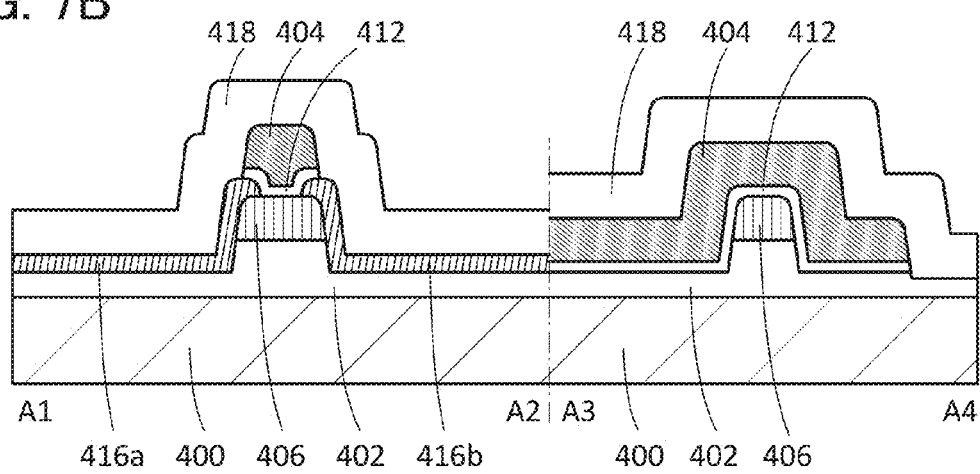

FIGS. 7A and 7B are a top view and a cross-sectional view which illustrate a transistor of one embodiment of the present invention. FIG. 7A is a top view and FIG. 7B is a cross-sectional view taken along dashed-dotted line A1-A2 and dashed-dotted line A3-A4 in FIG. 7A. Note that for simplification of the drawing, some components are not illustrated in the top view in FIG. 7A.

The transistor in FIGS. 7A and 7B includes an insulating film 402 having a projection over a substrate 400, a semiconductor film 406 over the projection of the insulating film 402, a conductive film 416a and a conductive film 416b in contact with a top surface and side surfaces of the semiconductor film 406, an insulating film 412 over the semiconductor film 406, the conductive film 416a, and the conductive film 416b, a conductive film 404 which is in contact with a top surface of the insulating film 412 and faces the top surface and the side surfaces of the semiconductor film 406, and an insulating film 418 over the conductive film 416a, the conductive film 416b, and the conductive film 404. Note that the insulating film 402 does not necessarily include a projection. The conductive film 404 serves as a gate electrode of the transistor. Further, the conductive film 416a and the conductive film 416b serve as a source electrode and a drain electrode of the transistor.

As illustrated in FIG. 7B, a side surface of the conductive film 416a and a side surface of the conductive film 416b are in contact with the side surfaces of the semiconductor film 406. The semiconductor film 406 can be electrically surrounded by an electric field of the conductive film 404 (a structure in which a semiconductor film is electrically surrounded by an electric field of a conductive film is referred to as a surrounded channel (s-channel) structure). Therefore, a channel is formed in the entire semiconductor film 406 (bulk) in some cases. In the s-channel structure, a large amount of current can flow between a source and a drain of a transistor, so that a high on-state current can be obtained.

The s-channel structure is suitable for a miniaturized transistor because a high on-state current can be obtained. A semiconductor device including the miniaturized transistor can have a high integration degree and high density. For example, the channel length of the transistor is preferably less than or equal to 40 nm, more preferably less than or equal to 30 nm, still more preferably less than or equal to 20 nm and the channel width of the transistor is preferably less than or equal to 40 nm, more preferably less than or equal to 30 nm, still more preferably less than or equal to 20 nm.

At least part (or all) of the conductive film 416a (and/or the conductive film 416b) is provided on at least part (or all) of a surface, a side surface, a top surface, and/or a bottom surface of a semiconductor film, e.g., the semiconductor film 406.

Alternatively, at least part (or all) of the conductive film 416a (and/or the conductive film 416b) is in contact with at least part (or all) of a surface, a side surface, a top surface, and/or a bottom surface of a semiconductor film, e.g., the semiconductor film 406. Further alternatively, at least part (or all) of the conductive film 416a (and/or the conductive film 416b) is in contact with at least part (or all) of a semiconductor film, e.g., the semiconductor film 406.

Alternatively, at least part (or all) of the conductive film 416a (and/or the conductive film 416b) is electrically connected to at least part (or all) of a surface, a side surface, a top surface, and/or a bottom surface of a semiconductor film, e.g., the semiconductor film 406. Alternatively, at least part (or all) of the conductive film 416a (and/or the conductive film 416b) is electrically connected to at least part (or all) of a semiconductor film, e.g., the semiconductor film 406.

Alternatively, at least part (or all) of the conductive film 416a (and/or the conductive film 416b) is provided near at least part (or all) of a surface, a side surface, a top surface, and/or a bottom surface of a semiconductor film, e.g., the semiconductor film 406. Alternatively, at least part (or all) of the conductive film 416a (and/or the conductive film 416b) is provided near at least part (or all) of a semiconductor film, e.g., the semiconductor film 406.

Alternatively, at least part (or all) of the conductive film 416a (and/or the conductive film 416b) is provided on a side of at least part (or all) of a surface, a side surface, a top surface, and/or a bottom surface of a semiconductor film, e.g., the semiconductor film 406. Alternatively, at least part (or all) of the conductive film 416a (and/or the conductive film 416b) is provided on a side of at least part (or all) of a semiconductor film, e.g., the semiconductor film 406.

Alternatively, at least part (or all) of the conductive film 416a (and/or the conductive film 416b) is provided obliquely above at least part (or all) of a surface, a side surface, a top surface, and/or a bottom surface of a semiconductor film, e.g., the semiconductor film 406. Alternatively, at least part (or all) of the conductive film 416a (and/or the conductive film 416b) is provided obliquely above at least part (or all) of a semiconductor film, e.g., the semiconductor film 406.

Alternatively, at least part (or all) of the conductive film 416a (and/or the conductive film 416b) is provided above at least part (or all) of a surface, a side surface, a top surface, and/or a bottom surface of a semiconductor film, e.g., the semiconductor film 406. Alternatively, at least part (or all) of the conductive film 416a (and/or the conductive film 416b) is provided above at least part (or all) of a semiconductor film, e.g., the semiconductor film 406.

Note that a channel length refers to a distance between a source (a source region or a source electrode) and a drain (a drain region or a drain electrode) in a region where a semiconductor film and a gate electrode overlap with each other in a top view. Accordingly, in FIG. 7A, the channel length is a distance between the conductive film 416a and the conductive film 416b in a region where the semiconductor film 406 and the conductive film 404 overlap with each other. A channel width refers to a length of a portion where a source and a drain face each other in parallel and where a semiconductor film and a gate electrode overlap with each other. Accordingly, in FIG. 7A, the channel width is a length of a portion where the conductive film 416a and the conductive film 416b face each other in parallel and where the semiconductor film 406 and the conductive film 404 overlap with each other.

For the substrate 400, the description of the substrate 100 is referred to. For the insulating film 402, the description of the insulating film 102 is referred to. For the semiconductor film 406, the description of the semiconductor film 106 is referred to. For the conductive film 416a and the conductive film 416b, the description of the conductive film 116a and the conductive film 116b is referred to. For the insulating film 412, the description of the insulating film 112 is referred to. For the conductive film 404, the description of the conductive film 104 is referred to.

The insulating film 418 may be formed of, for example, a single layer or a stack of an insulating film containing aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The insulating film 402 can have a function of preventing diffusion of impurities from the substrate 400. Here, in the case where the semiconductor film 406 is an oxide semiconductor film, the insulating film 402 can have a function of supplying oxygen to the semiconductor film 406. Therefore, the insulating film 402 is preferably an insulating film containing oxygen. For example, an insulating film containing oxygen more than that in the stoichiometric composition is preferable.

An oxide semiconductor film that can be used as the semiconductor film 406 is described in detail below.

The oxide semiconductor film that can be used as the semiconductor film 406 is an oxide containing indium. An oxide can have high carrier mobility (electron mobility) by containing indium, for example. The oxide semiconductor film preferably contains an element M. The element M is preferably aluminum, gallium, yttrium, tin, or the like. Other elements which can be used as the element M are boron, silicon, titanium, iron, nickel, germanium, yttrium, zirconium, molybdenum, lanthanum, cerium, neodymium, hafnium, tantalum, tungsten, and the like. Note that two or more of the above elements may be used in combination as the element M. The element M is an element having high bonding energy with oxygen, for example. The element M is an element that can increase the energy gap of the oxide, for example. Further, the oxide semiconductor film preferably contains zinc. When the oxide contains zinc, the oxide is easily to be crystallized, for example.

Note that the oxide semiconductor film is not limited to the oxide containing indium. The oxide semiconductor film may be, for example, zinc tin oxide or gallium tin oxide.

For the oxide semiconductor film, an oxide with a wide energy gap is used. For example, the energy gap of the oxide semiconductor film is greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

Influence of impurities in the oxide semiconductor film is described below. In order to obtain stable electrical characteristics of a transistor, it is effective to reduce the concentration of impurities in the oxide semiconductor film to have lower carrier density so that the oxide semiconductor film is highly purified. The carrier density of the oxide semiconductor film is lower than $1\times10^{17}/cm^3$, lower than $1\times10^{15}/cm^3$, or lower than $1\times10^{13}/cm^3$. In order to reduce the concentration of impurities in the oxide semiconductor film, the concentration of impurities in a film which is adjacent to the oxide semiconductor film is preferably reduced.

For example, silicon in the oxide semiconductor film might serve as a carrier trap or a carrier generation source. Therefore, the concentration of silicon in a region between the oxide semiconductor film and the insulating film 402 measured by secondary ion mass spectrometry (SIMS) is lower than $1\times10^{19}$ atoms/cm$^3$, preferably lower than $5\times10^{1\text{v}}$ atoms/cm$^3$, further preferably lower than $2\times10^{1\text{v}}$ atoms/cm$^3$. The concentration of silicon in a region between the oxide semiconductor film and the insulating film 412 measured by SIMS is lower than $1\times10^{19}$ atoms/cm$^3$, preferably lower than $5\times10^{18}$ atoms/cm$^3$, further preferably lower than $2\times10^{18}$ atoms/cm$^3$.

Furthermore, when hydrogen is contained in the oxide semiconductor film, the carrier density is increased in some cases. Thus, the concentration of hydrogen in the oxide semiconductor film, which is measured by SIMS, is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. When nitrogen is contained in the oxide semiconductor film, the carrier density is increased in some cases. The concentration of nitrogen in the oxide semiconductor film, which is measured by SIMS, is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

It is preferable to reduce the concentration of hydrogen in the insulating film 402 in order to reduce the concentration of hydrogen in the oxide semiconductor film. Thus, the concentration of hydrogen in the insulating film 402, which is measured by SIMS, is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{1\text{v}}$ atoms/cm$^3$. It is preferable to reduce the concentration of nitrogen in the insulating film 402 in order to reduce the concentration of nitrogen in the oxide semiconductor film. The concentration of nitrogen in the insulating film 402, which is measured by SIMS, is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

It is preferable to reduce the concentration of hydrogen in the insulating film 412 in order to reduce the concentration of hydrogen in the oxide semiconductor film. Thus, the concentration of hydrogen in the insulating film 412, which is measured by SIMS, is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. It is preferable to reduce the concentration of nitrogen in the insulating film 412 in order to reduce the concentration of nitrogen in the oxide semiconductor film. The concentration of nitrogen in the insulating film 412, which is measured by SIMS, is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

A structure of the oxide semiconductor film is described below.

An oxide semiconductor film is classified roughly into a non-single-crystal oxide semiconductor film and a single crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First of all, a CAAC-OS film is described.

The CAAC-OS film is an oxide semiconductor film including a plurality of crystal parts. Most of the crystal parts each fit inside a cube whose one side is less than 100 nm. Thus, the CAAC-OS film may include a crystal part that fits inside a cube whose one side is less than 10 nm, less than 5 nm, or less than 3 nm.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is unlikely to occur.

In the TEM image of the CAAC-OS film observed in a direction substantially parallel to a sample surface (cross-sectional TEM image), metal atoms are arranged in a layered manner in the crystal parts. Each metal atom layer has a morphology reflecting a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

In the TEM image of the CAAC-OS film observed in a direction substantially perpendicular to the sample surface (plan TEM image), metal atoms are arranged in a triangular or hexagonal configuration in the crystal parts. However, there is no regularity in arrangement of metal atoms between different crystal parts.

Note that in an electron diffraction pattern of the CAAC-OS film, spots (bright spots) having alignment are shown. For example, when electron diffraction with an electron beam having a diameter of 1 nm or more and 30 nm or less (such electron diffraction is also referred to as nanobeam electron diffraction) is performed on the top surface of the CAAC-OS film, spots are observed (see FIG. 8A).

From the cross-sectional TEM image and the plan TEM image, orientation characteristics are found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

In this specification, trigonal and rhombohedral crystal systems are included in a hexagonal crystal system.

When the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Analysis (φ scan) is performed under conditions where the sample is rotated around a normal vector of the sample surface as an axis (φ axis) with 2θ fixed at around 56°. When the sample is a single-crystal oxide semiconductor film of $InGaZnO_4$, six peaks appear. The six peaks are derived from crystal planes equivalent to the (110) plane. In contrast, when the sample is the CAAC-OS layer, a peak is not clearly observed.

The above results mean that in the CAAC-OS film having c-axis alignment, the directions of a-axes and b-axes are different between crystal parts, but the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is oriented in a direction parallel to a normal vector of a formation surface or a normal vector of a top surface of the CAAC-OS film. Thus, for example, when the shape of the CAAC-OS film is changed by etching or the like, the c-axis might not be necessarily parallel to a normal vector of a formation surface or a normal vector of a top surface of the CAAC-OS film.

Furthermore, the degree of crystallinity in the CAAC-OS film is not necessarily uniform. For example, if crystal growth leading to the CAAC-OS film occurs from the vicinity of the top surface of the film, the degree of the crystallinity in the vicinity of the top surface may be higher than that in the vicinity of the formation surface. Moreover, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of 2θ may be observed at around 36°, in addition to the peak of 2θ at around 31°. The peak of 2θ at around 36° indicates that a crystal having no c-axis alignment is included in part of the CAAC-OS film. It is preferable that a peak of 2θ appear at around 31° and a peak of 2θ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. A heavy metal such as iron or nickel, argon, carbon dioxide, or the like has a large atomic radius (molecular radius), and thus disturbs the atomic arrangement of the oxide semiconductor film and causes a decrease in crystallinity if contained in the oxide semiconductor film. Note that the impurity contained in the oxide semiconductor film might serve as a carrier trap or a carrier generation source.

The CAAC-OS film is an oxide semiconductor film having a low density of defect states. Oxygen vacancies in the oxide semiconductor film may serve as carrier traps or carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released, and thus may behave like fixed electric charge. Accordingly, the transistor which includes the oxide semiconductor film having high impurity concentration and a high density of defect states can have unstable electrical characteristics.

In a transistor using the CAAC-OS film, change in electrical characteristics due to irradiation with visible light or ultraviolet light is small.

Next, a microcrystalline oxide semiconductor film will be described.

In a TEM image, crystal parts cannot be found clearly in the microcrystalline oxide semiconductor film in some cases. In most cases, the size of a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In a TEM image of the nc-OS film, for example, a crystal grain boundary cannot clearly found in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. There is no regularity of crystal orientation between different crystal parts in the nc-OS film. Thus, the orientation of the whole film is not observed. Accordingly, the nc-OS film sometimes cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. Furthermore, a halo pattern is shown in an electron diffraction pattern (also referred to as a selected-area electron diffraction pattern) of the nc-OS film obtained by using an electron beam having a probe diameter (e.g., greater than or equal to 50 nm) larger than the diameter of a crystal part. Meanwhile, spots are shown in a nanobeam electron diffraction pattern of the nc-OS film obtained by using an electron beam having a probe diameter close to, or smaller than or equal to a diameter of a crystal part. In a nanobeam electron diffraction pattern of the nc-OS film, regions with high luminance in a circular (ring) pattern may be shown, and a plurality of spots may be shown in the ring-like region (see FIG. 8B).

The nc-OS film is an oxide semiconductor film that has high regularity as compared with an amorphous oxide semiconductor film. For this reason, the nc-OS film has a lower density of defect states than an amorphous oxide semiconductor film. However, there is no regularity of crystal orientation between different crystal parts in the nc-OS film; hence, the nc-OS film has a higher density of defect states than the CAAC-OS film.

Note that an oxide semiconductor film may include two or more films of an amorphous oxide semiconductor film, a microcrystalline oxide semiconductor film, and a CAAC-OS film, for example.

In the case where the oxide semiconductor film has a plurality of structures, the structures can be analyzed using nanobeam electron diffraction in some cases.

Figure 9A:
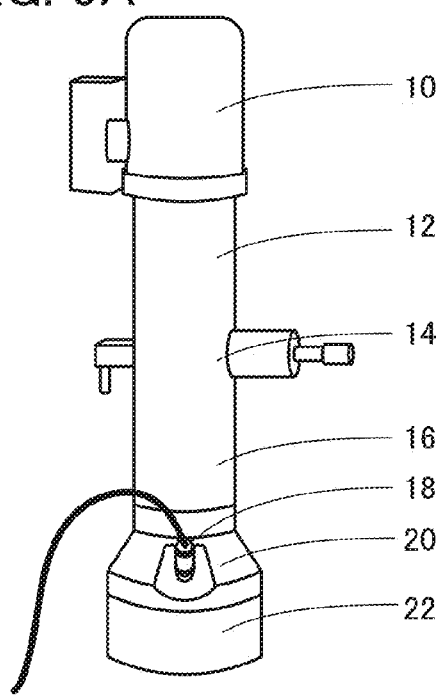
FIGS. 9A and 9B illustrate an example of a transmission electron diffraction measurement apparatus.

FIG. 9A illustrates a transmission electron diffraction measurement apparatus which includes an electron gun chamber 10, an optical system 12 under the electron gun chamber 10, a sample chamber 14 under the optical system 12, an optical system 16 under the sample chamber 14, an observation chamber 20 under the optical system 16, a camera 18 installed in the observation chamber 20, and a film chamber 22 under the observation chamber 20. The camera 18 is provided to face toward the inside of the observation chamber 20. Note that the film chamber 22 is not necessarily provided.

Figure 9B:
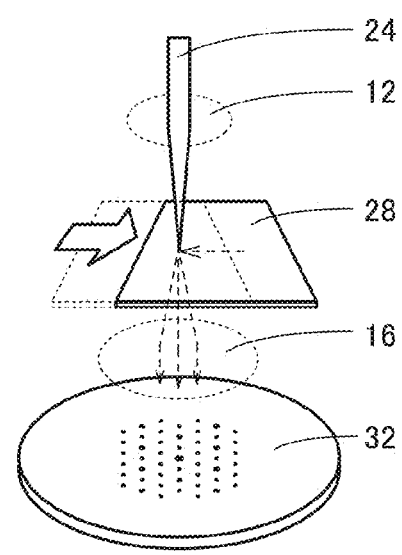

FIG. 9B illustrates an internal structure of the transmission electron diffraction measurement apparatus illustrated in FIG. 9A. In the transmission electron diffraction measurement apparatus, a substance 28 which is positioned in the sample chamber 14 is irradiated with electrons emitted from an electron gun installed in the electron gun chamber 10 through the optical system 12. Electrons passing through the substance 28 enter a fluorescent plate 32 provided in the observation chamber 20 through the optical system 16. On the fluorescent plate 32, a pattern corresponding to the intensity of entered electron appears, which allows measurement of a transmission electron diffraction pattern.

The camera 18 is installed so as to face the fluorescent plate 32 and can take a picture of a pattern appearing in the fluorescent plate 32. An angle formed by a straight line which passes through the center of a lens of the camera 18 and the center of the fluorescent plate 32 and an upper surface of the fluorescent plate 32 is, for example, 15° or more and 80° or less, 30° or more and 75° or less, or 45° or more and 70° or less. As the angle is reduced, distortion of the transmission electron diffraction pattern taken by the camera 18 becomes larger. Note that if the angle is obtained in advance, the distortion of an obtained transmission electron diffraction pattern can be corrected. Note that the film chamber 22 may be provided with the camera 18. For example, the camera 18 may be set in the film chamber 22 so as to be opposite to the incident direction of electrons 24. In this case, a transmission electron diffraction pattern with less distortion can be taken from the rear surface of the fluorescent plate 32.

A holder for fixing the substance 28 that is a sample is provided in the sample chamber 14. The holder transmits electrons passing through the substance 28. Moreover, the holder may have, for example, a function of moving the substance 28 in the direction of the X, Y, and Z axes. The movement function of the holder may have an accuracy of moving the substance in the range of, for example, 1 nm to 10 nm, 5 nm to 50 nm, 10 nm to 100 nm, 50 nm to 500 nm, and 100 nm to 1 µm. The range is preferably determined to be an optimal range for the structure of the substance 28.

Then, a method for measuring a transmission electron diffraction pattern of a substance by the transmission electron diffraction measurement apparatus described above is described.

Figure 8A:
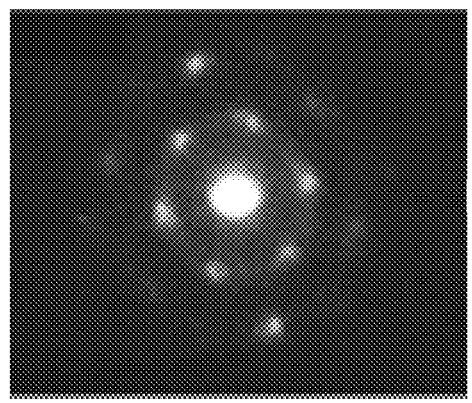
FIGS. 8A and 8B each show a nanobeam electron diffraction pattern of an oxide semiconductor film.
Figure 8B:
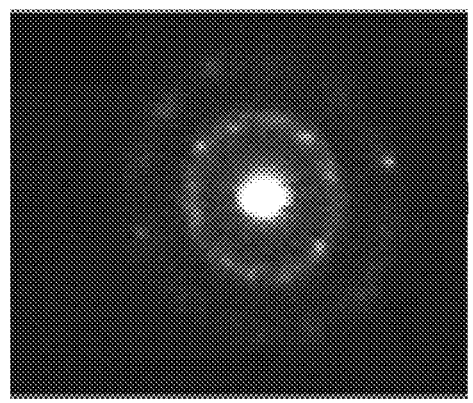

For example, changes in the structure of a substance can be observed by changing (scanning) the irradiation position of the electrons 24 that are a nanobeam in the substance, as illustrated in FIG. 9B. At this time, when the substance 28 is a CAAC-OS film, a diffraction pattern as shown in FIG. 8A is observed. When the substance 28 is an nc-OS film, a diffraction pattern shown in FIG. 8B is observed.

Even when the substance 28 is a CAAC-OS film, a diffraction pattern similar to that of an nc-OS film or the like is partly observed in some cases. Therefore, whether or not a CAAC-OS film is favorable can be determined by the proportion of a region where a diffraction pattern of a CAAC-OS film is observed in a predetermined area (also referred to as proportion of CAAC). In the case of a high quality CAAC-OS film, for example, the proportion of CAAC is higher than or equal to 60%, preferably higher than or equal to 80%, further preferably higher than or equal to 90%, still further preferably higher than or equal to 95%. Note that a proportion of a region where a diffraction pattern different from that of a CAAC-OS film is observed is referred to as the proportion of not-CAAC.

For example, transmission electron diffraction patterns were obtained by scanning a top surface of a sample including a CAAC-OS film obtained just after deposition (represented as "as-depo") and a top surface of a sample including a CAAC-OS subjected to heat treatment at 350° C. or 450° C. Here, the proportion of CAAC was obtained in such a manner that diffraction patterns were observed by scanning for 60 seconds at a rate of 5 nm/second and the obtained diffraction patterns were converted into still images every 0.5 seconds. Note that as an electron beam, a nanobeam with a probe diameter of 1 nm was used.

Figure 10:
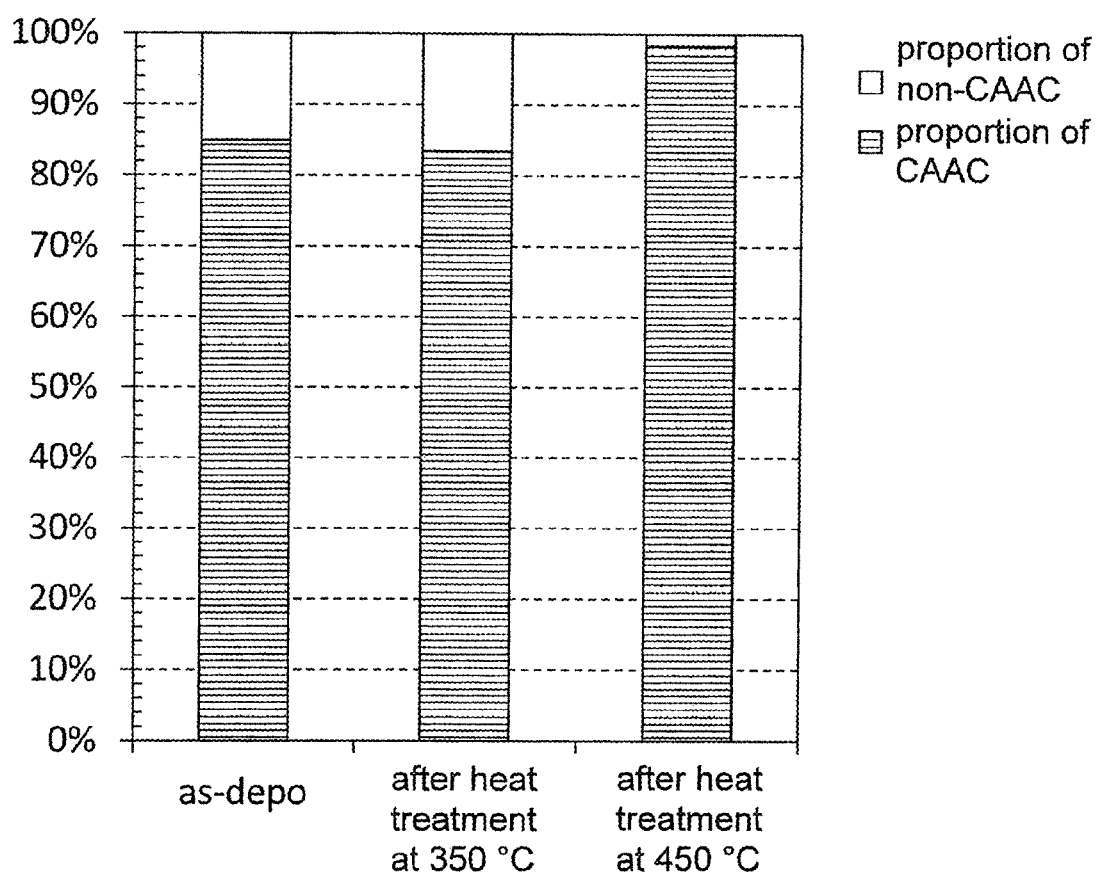
FIG. 10 illustrates an example of a structure analysis by transmission electron diffraction measurement.

FIG. 10 shows the proportion of CAAC in each sample. These results show that the proportion of CAAC obtained after the heat treatment at 450° C. is higher than that obtained just after the deposition or after the heat treatment at 350° C. That is, heat treatment at a temperature higher than 350° C. (e.g., higher than or equal to 400° C.) reduces the proportion of non-CAAC (increases the proportion of CAAC). Here, most of diffraction patterns different from that of a CAAC-OS film are diffraction patterns similar to that of an nc-OS film. Therefore, the above results suggest that the region having a structure similar to that of an nc-OS film becomes CAAC by the heat treatment owing to the influence of the structure of the adjacent region.

With such a measurement method, the structure of an oxide semiconductor film having a plurality of structures can be analyzed in some cases.

Figure 11A:
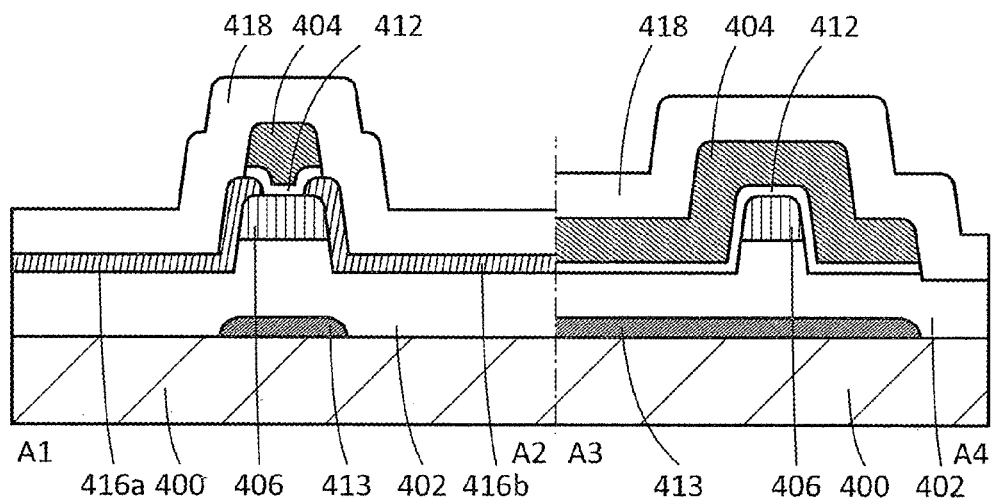
FIGS. 11A and 11B are cross-sectional views illustrating transistors of embodiments of the present invention.
Figure 11B:
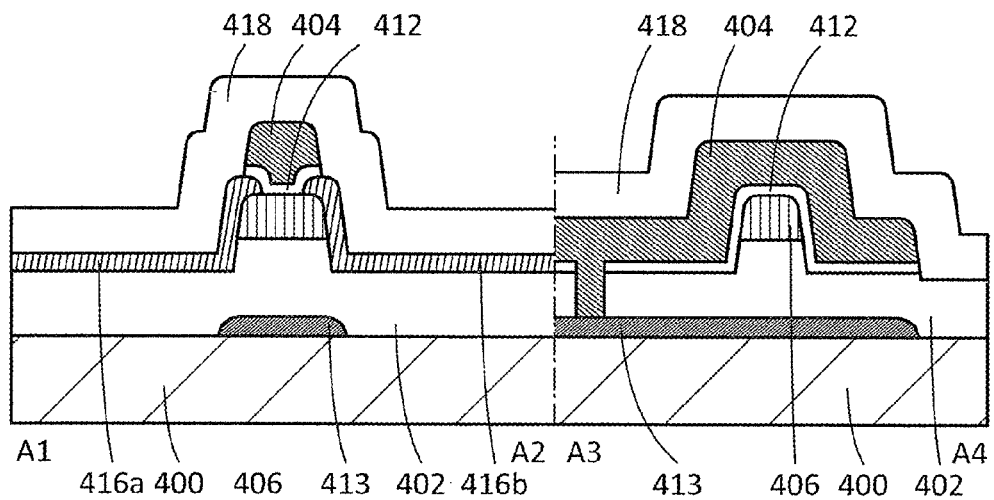

Although FIGS. 7A and 7B show an example in which the gate electrode of the transistor is provided above the semiconductor film 406, a semiconductor device of one embodiment of the present invention is not limited thereto. As illustrated in FIG. 11A, a conductive film 413 that can function as a gate electrode may be provided below the semiconductor film 406. For the conductive film 413, the description of the conductive film 404 is referred to. Note that a potential or signal which is the same as that supplied to the conductive film 404 or a potential or signal which is different from that supplied to the conductive film 404 may be supplied to the conductive film 413. For example, by supplying a constant potential to the conductive film 413, the threshold voltage of a transistor may be controlled. FIG. 11B shows an example in which the conductive film 413 and the conductive film 404 are connected to each other through an opening. Even in the case other than the case illustrated in FIGS. 7A and 7B, the conductive film 413 capable of functioning as a gate electrode can be similarly provided.

<Modification Example of Transistor Structure 1>

Figure 12A:
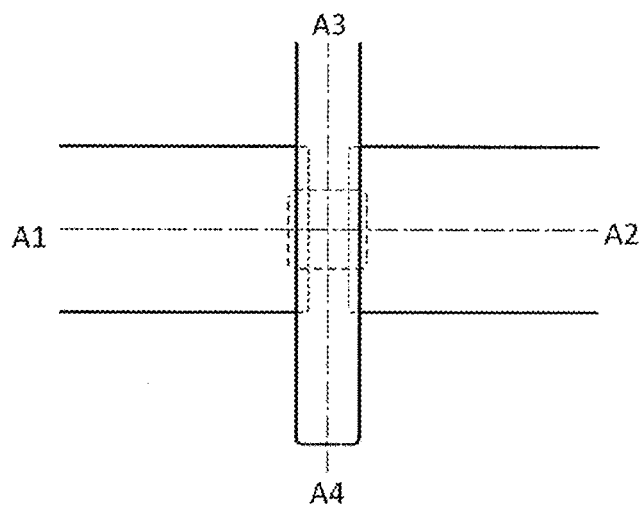
FIGS. 12A and 12B are a top view and a cross-sectional view illustrating a transistor of one embodiment of the present invention.
Figure 12B:
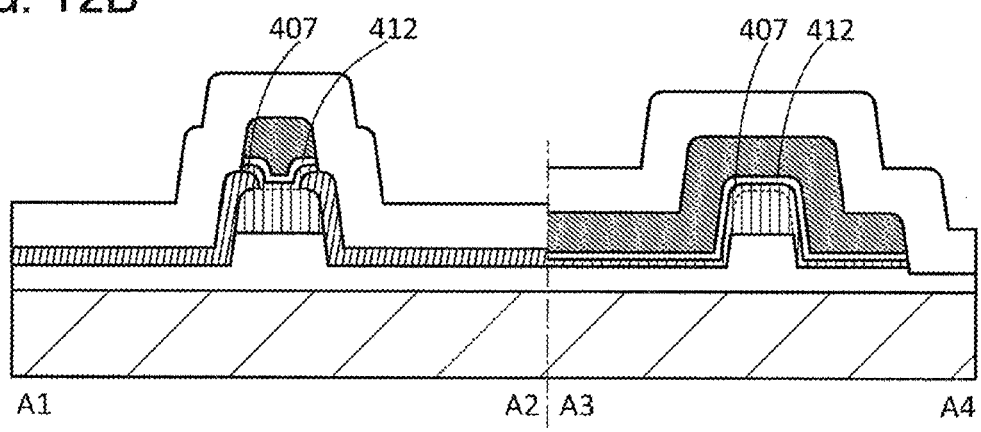

As in a transistor illustrated in FIGS. 12A and 12B, a semiconductor film 407 may be provided under the insulating film 412. As the semiconductor film 407, the semiconductor film shown as the semiconductor film 406 may be used. Note that description of the transistor in FIGS. 7A and 7B is referred to for the structures of the other components.

Figure 13A:
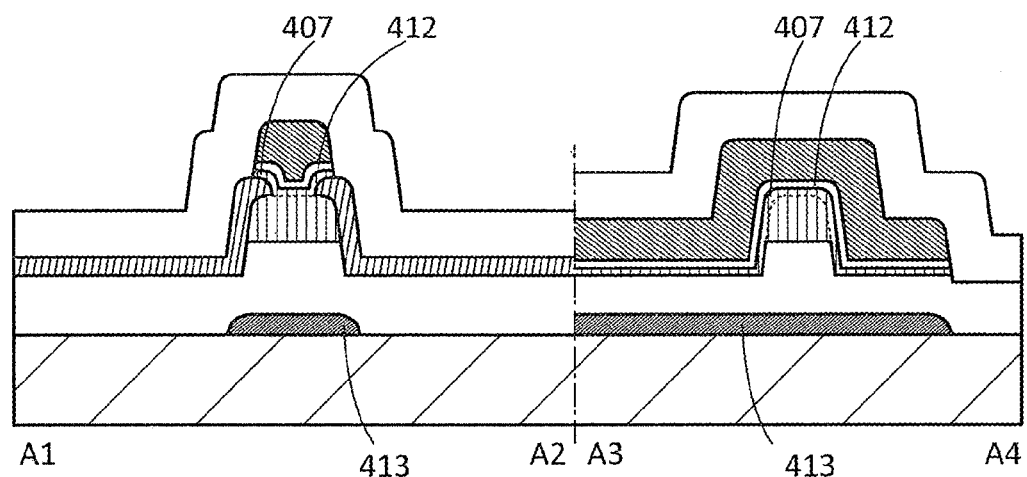
FIGS. 13A and 13B are cross-sectional views illustrating transistors of embodiments of the present invention.
Figure 13B:
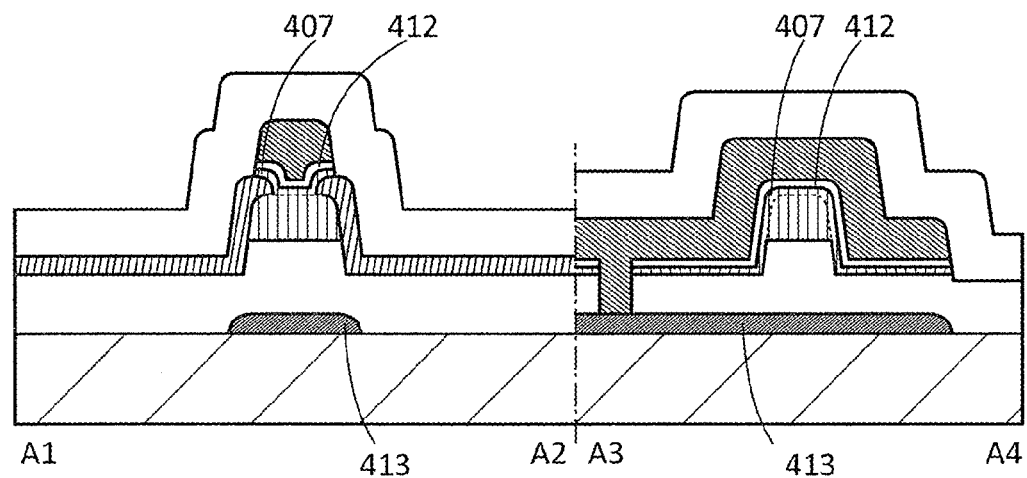

Although FIGS. 12A and 12B show an example in which the gate electrode of the transistor is provided above the semiconductor film 406, a semiconductor device of one embodiment of the present invention is not limited thereto. As illustrated in FIG. 13A, the conductive film 413 that can function as a gate electrode may be provided below the semiconductor film 406. For the conductive film 413, description of the conductive film 404 is referred to. Note that a potential or signal which is the same as that supplied to the conductive film 404 or a potential or signal which is different from that supplied to the conductive film 404 may be supplied to the conductive film 413. For example, by supplying a constant potential to the conductive film 413, the threshold voltage of a transistor may be controlled. FIG. 13B shows an example in which the conductive film 413 and the conductive film 404 are connected to each other through an opening. Even in the case other than the cases illustrated in FIGS. 7A and 7B and FIGS. 12A and 12B, the conductive film 413 capable of functioning as a gate electrode can be similarly provided.

<Transistor Structure 2>

Figure 14A:
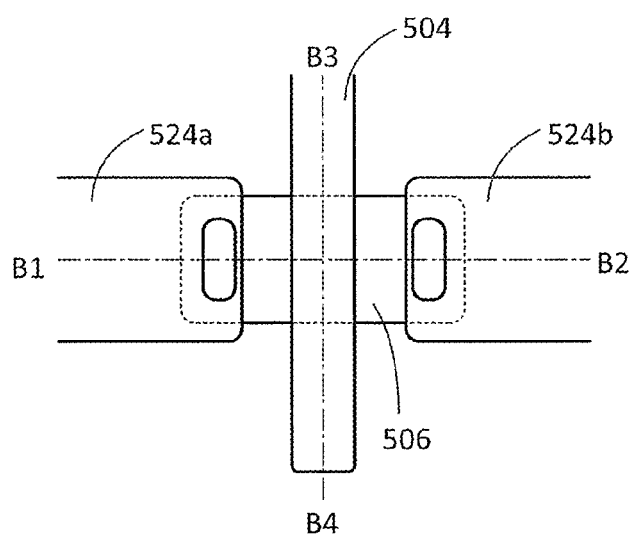
FIGS. 14A and 14B are a top view and a cross-sectional view illustrating a transistor of one embodiment of the present invention.
Figure 14B:
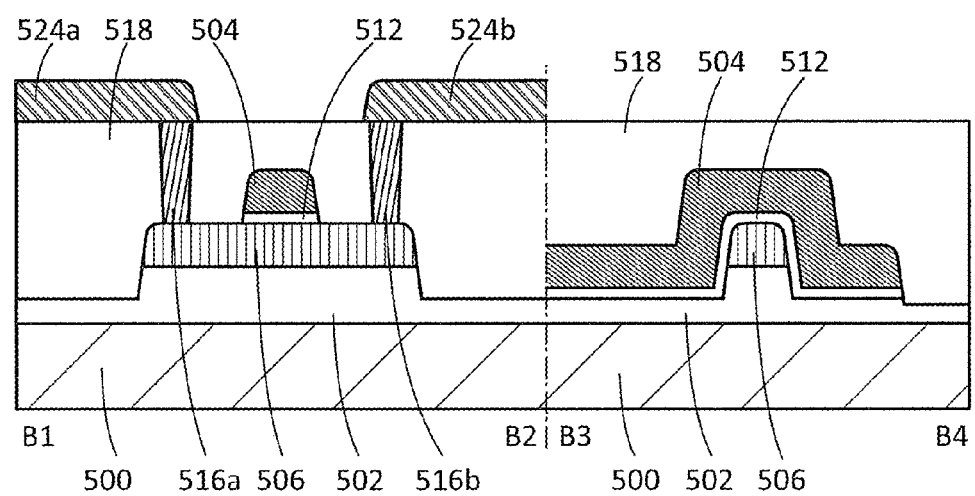

FIGS. 14A and 14B are a top view and a cross-sectional view which illustrate a transistor of one embodiment of the present invention. FIG. 14A is a top view and FIG. 14B is a cross-sectional view taken along dashed-dotted line B1-B2 and dashed-dotted line B3-B4 in FIG. 14A. Note that for simplification of the drawing, some components are not illustrated in the top view in FIG. 14A.

The transistor in FIGS. 14A and 14B includes an insulating film 502 having a projection over a substrate 500, a semiconductor film 506 over the projection of the insulating film 502, an insulating film 512 over the semiconductor film 506, a conductive film 504 which is in contact with a top surface of the insulating film 512 and faces a top surface and side surfaces of the semiconductor film 506, an insulating film 518 which is over the semiconductor film 506 and the conductive film 504 and includes openings reaching the semiconductor film 506, a conductive film 516a and a conductive film 516b with which the openings are filled, and a conductive film 524a and a conductive film 524b which are in contact with the conductive film 516a and the conductive film 516b, respectively. Note that the insulating film 502 does not necessarily include a projection. The conductive film 504 serves as a gate electrode of the transistor. Further, the conductive film 516a and the conductive film 516b serve as a source electrode and a drain electrode of the transistor.

In the transistor in FIGS. 14A and 14B, the conductive film 516a and the conductive film 516b are provided so as not to overlap with the conductive film 504. Thus, parasitic capacitance between the conductive film 516a and the conductive film 504 and parasitic capacitance between the conductive film 516b and the conductive film 504 can be reduced. For this reason, the transistor in FIGS. 14A and 14B can have excellent switching characteristics.

Further, since the level of the top surface of the insulating film 518, that of the conductive film 516a, and that of the conductive film 516b are the same, shape defects do not easily occur. Therefore, a semiconductor device including the transistor can be manufactured with high yield.

The conductive film 524a and the conductive film 524b each may be formed to have a single-layer structure or a stacked-layer structure using a conductive film containing one or more kinds of aluminum, titanium, chromium, cobalt, nickel, copper, yttrium, zirconium, molybdenum, ruthenium, silver, tantalum, and tungsten, for example.

For the substrate 500, the description of the substrate 400 is referred to. For the insulating film 502, the description of the insulating film 402 is referred to. For the semiconductor film 506, the description of the semiconductor film 406 is referred to. For the conductive film 516a and the conductive film 516b, the description of the conductive film 416a and the conductive film 416b is referred to. For the insulating film 512, the description of the insulating film 412 is referred to. For the conductive film 504, the description of the conductive film 404 is referred to. For the insulating film 518, the description of the insulating film 418 is referred to.

Figure 15A:
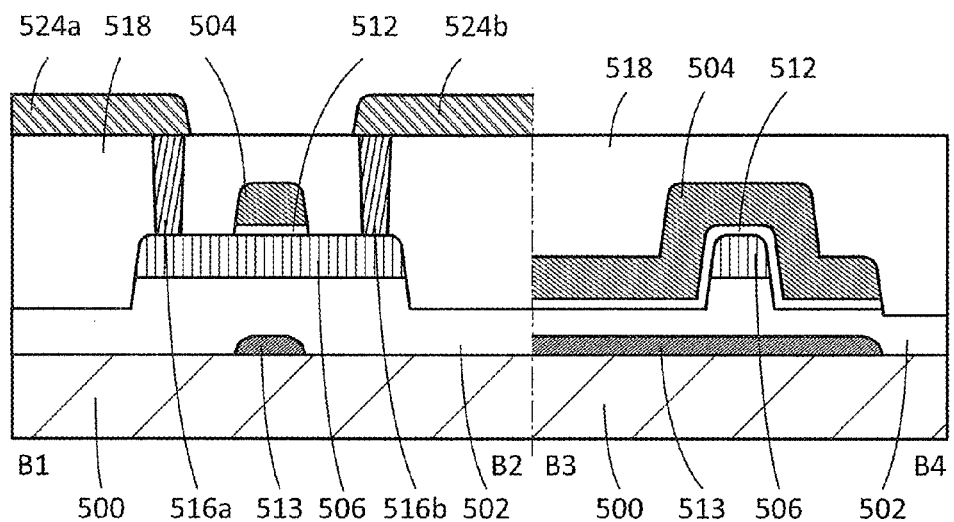
FIGS. 15A and 15B are cross-sectional views illustrating transistors of embodiments of the present invention.
Figure 15B:
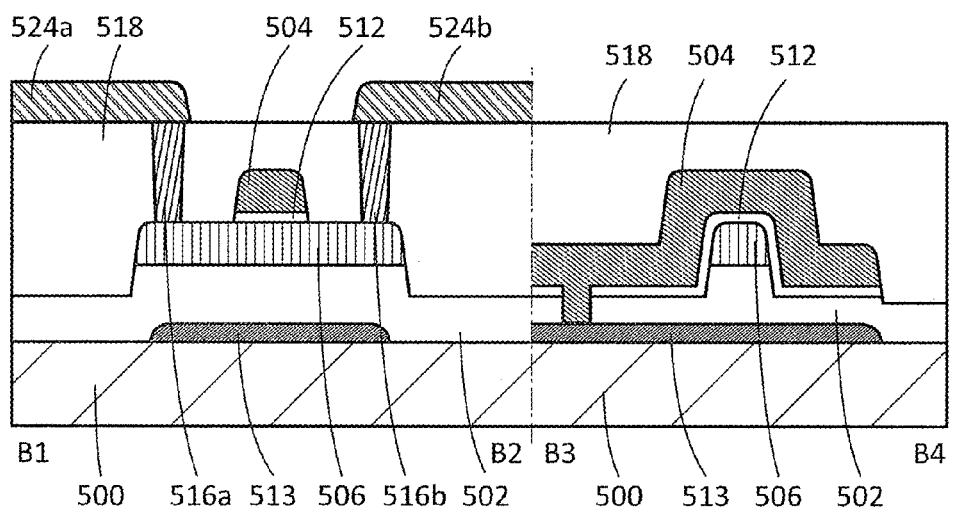

Although FIGS. 14A and 14B show an example in which the gate electrode of the transistor is provided above the semiconductor film 506, a semiconductor device of one embodiment of the present invention is not limited thereto. As illustrated in FIG. 15A, a conductive film 513 that can function as a gate electrode may be provided below the semiconductor film 506. For the conductive film 513, the description of the conductive film 504 is referred to. Note that a potential or signal which is the same as that supplied to the conductive film 504 or a potential or signal which is different from that supplied to the conductive film 504 may be supplied to the conductive film 513. For example, by supplying a constant potential to the conductive film 513, the threshold voltage of a transistor may be controlled. FIG. 15B shows an example in which the conductive film 513 and the conductive film 504 are connected to each other through an opening. The conductive film 513 may be provided so as to overlap with the conductive film 524a and the conductive film 524b. An example in that case is shown in FIG. 15B. Even in the case other than the cases illustrated in FIGS. 7A and 7B, FIGS. 12A and 12B, and FIGS. 14A and 14B, the conductive film 513 capable of functioning as the gate electrode can be similarly provided.

<Modification Example of Transistor Structure 2>

In the transistor illustrated in FIGS. 14A and 14B, a semiconductor film may be provided under the insulating film 512. For the semiconductor film, the description of the semiconductor film 407 is referred to. Note that the description of the transistor in FIGS. 14A and 14B is referred to for the structures of the other components.

<Transistor Structure 3>

Figure 16A:
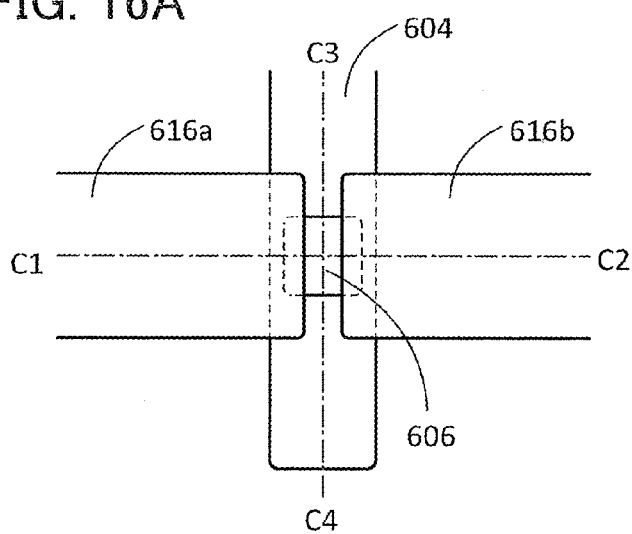
FIGS. 16A and 16B are a top view and a cross-sectional view illustrating a transistor of one embodiment of the present invention.
Figure 16B:
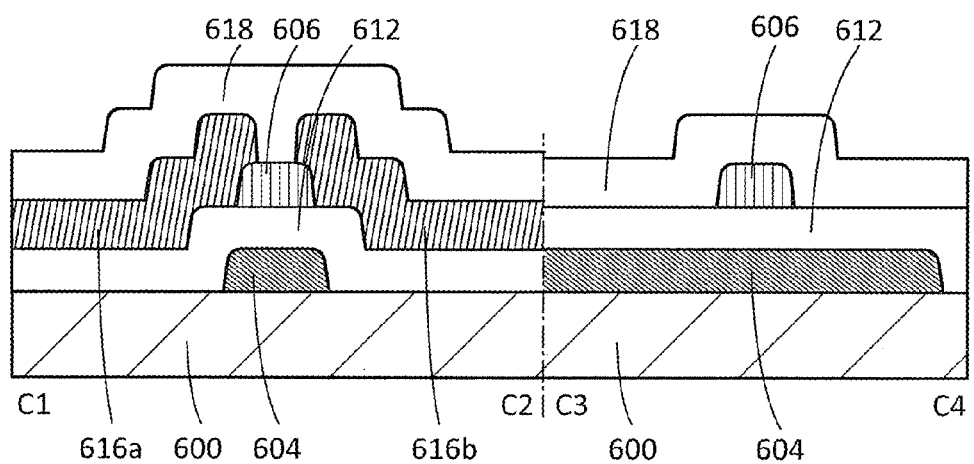

FIGS. 16A and 16B are a top view and a cross-sectional view which illustrate a transistor of one embodiment of the present invention. FIG. 16A is a top view and FIG. 16B is a cross-sectional view taken along dashed-dotted line C1-C2 and dashed-dotted line C3-C4 in FIG. 16A. Note that for simplification of the drawing, some components are not illustrated in the top view in FIG. 16A.

The transistor illustrated in FIGS. 16A and 16B includes a conductive film 604 over a substrate 600, an insulating film 612 over the conductive film 604, a semiconductor film 606 over the insulating film 612, a conductive film 616a and a conductive film 616b in contact with a top surface and side surfaces of the semiconductor film 606, and an insulating film 618 over the semiconductor film 606, the conductive film 616a, and the conductive film 616b. Note that an insulating film may be provided between the substrate 600 and the conductive film 604. The conductive film 604 functions as a gate electrode of the transistor. Further, the conductive film 616a and the conductive film 616b serve as a source electrode and a drain electrode of the transistor.

The transistor may include a conductive film which overlaps with the semiconductor film 606 with the insulating film 618 provided therebetween. The conductive film functions as a second gate electrode of the transistor. Further, an s-channel structure may be formed using the second gate electrode.

For the substrate 600, the description of the substrate 400 is referred to. For the conductive film 604, the description of the conductive film 404 is referred to. For the insulating film 612, the description of the insulating film 412 is referred to. For the semiconductor film 606, the description of the semiconductor film 406 is referred to. For the conductive film 616a and the conductive film 616b, the description of the conductive film 416a and the conductive film 416b is referred to. For the insulating film 618, the description of the insulating film 418 is referred to.

Over the semiconductor film 606, an insulating film that can function as a channel protective film may be provided. Alternatively, an insulating film may be provided between the semiconductor film 606 and the conductive films 616a and 616b. In that case, the conductive film 616a (conductive film 616b) and the semiconductor film 606 are connected to each other through an opening in the insulating film. For these insulating films, the description of the insulating film 412 may be referred to.

<Semiconductor Device>

An example of a semiconductor device of one embodiment of the present invention is shown below.

<Circuit>

An example of a circuit including a transistor of one embodiment of the present invention is shown below.

[Cross-Sectional Structure]

Figure 17A:
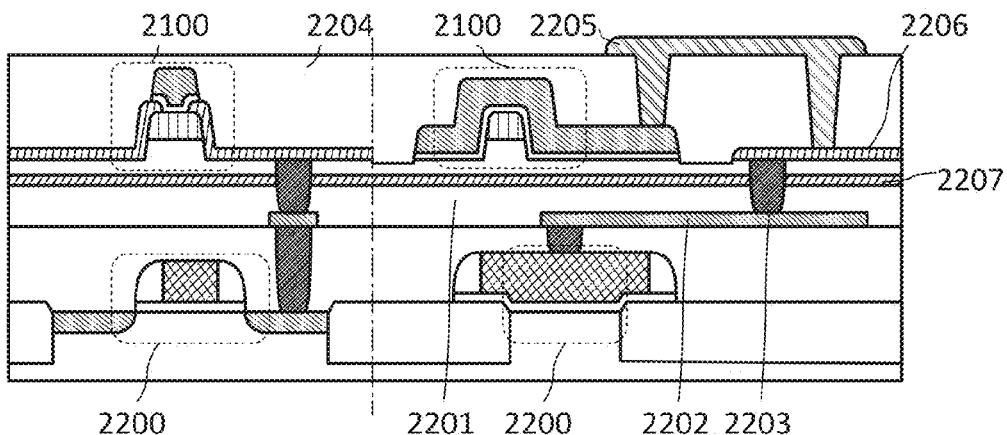
FIGS. 17A to 17D are cross-sectional views and circuit diagrams of semiconductor devices of embodiments of the present invention.

FIG. 17A is a cross-sectional view of a semiconductor device of one embodiment of the present invention. The semiconductor device illustrated in FIG. 17A includes a transistor 2200 using a first semiconductor in a lower portion and a transistor 2100 using a second semiconductor in an upper portion. FIG. 17A shows an example in which the transistor illustrated in FIGS. 7A and 7B is used as the transistor 2100 using the second semiconductor.

As the first semiconductor, a semiconductor having an energy gap different from that of the second semiconductor may be used. For example, the first semiconductor may be a semiconductor other than an oxide semiconductor and the second semiconductor may be an oxide semiconductor. When single crystal silicon is used as the first semiconductor, the transistor 2200 capable of high-speed operation can be obtained. When an oxide semiconductor is used as the second semiconductor, the transistor 2100 that is suitable for low off-state current can be obtained.

Note that the transistor 2200 may be either an n-channel transistor or a p-channel transistor, and an appropriate transistor is used in accordance with a circuit. As the transistor 2100 and/or the transistor 2200, the above-described transistor or the transistor illustrated in FIG. 17A is not necessarily used in some cases.

The semiconductor device illustrated in FIG. 17A includes the transistor 2100 above the transistor 2200 with an insulating film 2201 and an insulating film 2207 provided therebetween. Between the transistor 2200 and the transistor 2100, a plurality of conductive films 2202 which function as wirings are provided. Wirings or electrodes provided in an upper layer and a lower layer are electrically connected to each other by a plurality of conductive films 2203 embedded in insulating films. Further, the semiconductor device includes an insulating film 2204 over the transistor 2100, a conductive film 2205 over the insulating film 2204, and a conductive film 2206 formed in the same layer (through the same steps) as a source electrode and a drain electrode of the transistor 2100.

By stacking a plurality of transistors, a plurality of circuits can be arranged with high density.

Here, in the case where single crystal silicon is used as the first semiconductor of the transistor 2200, the hydrogen concentration in an insulating film near the first semiconductor of the transistor 2200 is preferably high. The hydrogen terminates dangling bonds of silicon, so that the reliability of the transistor 2200 can be increased. On the other hand, in the case where an oxide semiconductor is used as the second semiconductor of the transistor 2100, the hydrogen concentration in an insulating film near the second semiconductor of the transistor 2100 is preferably low. The hydrogen causes generation of carriers in the oxide semiconductor, which might lead to a decrease in the reliability of the transistor 2100. Therefore, in the case where the transistor 2200 using single crystal silicon and the transistor 2100 using an oxide semiconductor are stacked, providing the insulating film 2207 having a function of blocking hydrogen between the transistors is effective because the reliability of the transistors can be increased.

The insulating film 2207 may be, for example, formed to have a single-layer structure or a stacked-layer structure using an insulating film containing aluminum oxide, aluminum oxynitride, gallium oxide, gallium oxynitride, yttrium oxide, yttrium oxynitride, hafnium oxide, hafnium oxynitride, yttria-stabilized zirconia (YSZ), or the like.

Further, an insulating film having a function of blocking hydrogen is preferably formed over the transistor 2100 to cover the transistor 2100 using an oxide semiconductor. As the insulating film, an insulating film that is similar to the insulating film 2207 can be used, and in particular, an aluminum oxide film is preferably used. The aluminum oxide film has a high blocking effect of preventing penetration of both oxygen and impurities such as hydrogen and moisture. Thus, by using the aluminum oxide film as the insulating film covering the transistor 2100, release of oxygen from the oxide semiconductor included in the transistor 2100 can be prevented and entry of water and hydrogen into the oxide semiconductor can be prevented.

Note that the transistor 2200 can be a transistor of various types without being limited to a planar type transistor. For example, a FIN-type transistor can be used. An example of a cross-sectional view in this case is shown in FIG. 17D. An insulating layer 2212 is provided over a semiconductor substrate 2211. The semiconductor substrate 2211 includes a projection portion with a thin tip (also referred to a fin). Alternatively, the projection portion may not have the thin tip; a projection portion with a cuboid-like projection portion and a projection portion with a thick tip are permitted, for example. A gate insulating film 2214 is provided over the projection portion of the semiconductor substrate 2211, and a gate electrode 2213 is provided over the gate insulating film 2214. Source and drain regions 2215 are formed in the semiconductor substrate 2211. Note that here is shown an example in which the semiconductor substrate 2211 includes the projection portion; however, a semiconductor device of one embodiment of the present invention is not limited thereto. For example, a semiconductor region having a projection portion may be formed by processing an SOI substrate.

[Circuit Configuration Example]

In the above circuit, electrodes of the transistor 2100 and the transistor 2200 can be connected in a variety of ways; thus, a variety of circuits can be formed. Examples of circuit configurations which can be achieved by using a semiconductor device of one embodiment of the present invention are shown below.

[CMOS Inverter]

Figures 17B, 17C:
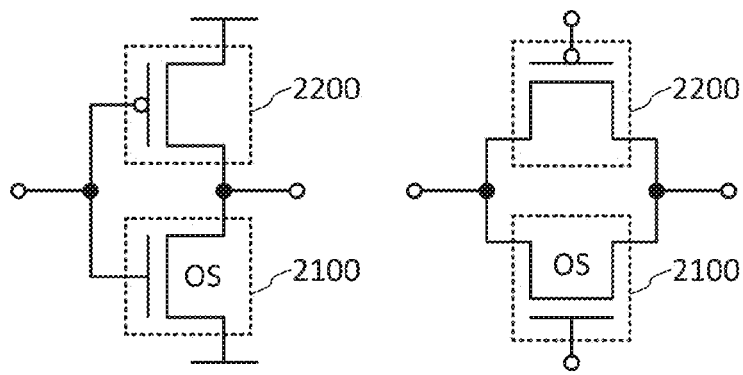
Figure 17D:
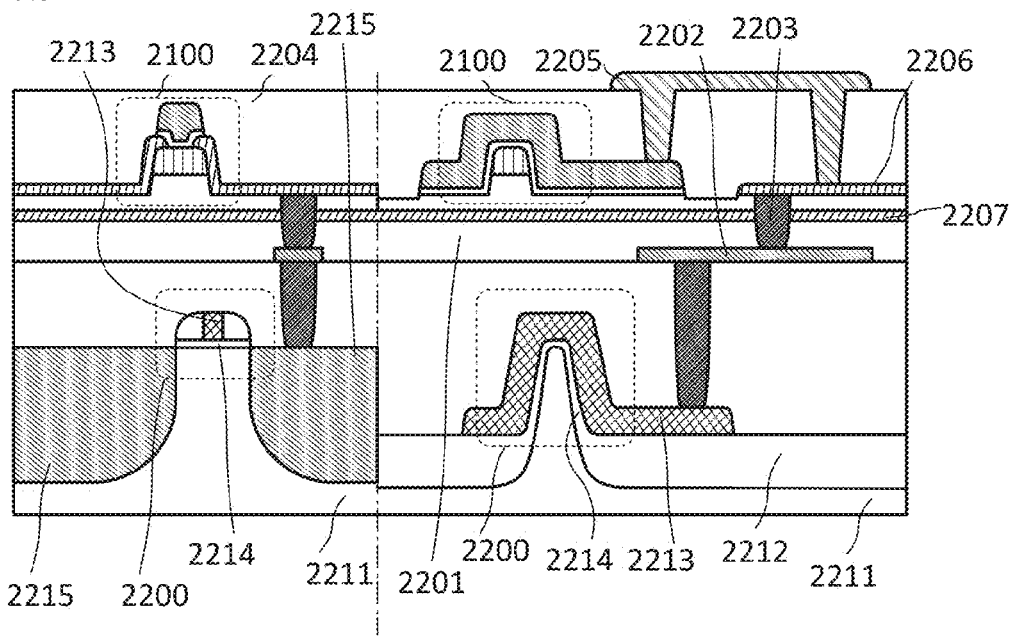

A circuit diagram in FIG. 17B shows a configuration of a so-called CMOS inverter circuit in which the p-channel transistor 2200 and the n-channel transistor 2100 are connected to each other in series and in which gates of them are connected to each other.

[CMOS Analog Switch]

A circuit diagram in FIG. 17C shows a configuration in which sources of the transistors 2100 and 2200 are connected to each other and drains of the transistors 2100 and 2200 are connected to each other. With such a configuration, the transistors can function as a so-called CMOS analog switch.

[Memory Device Example]

Figure 18A:
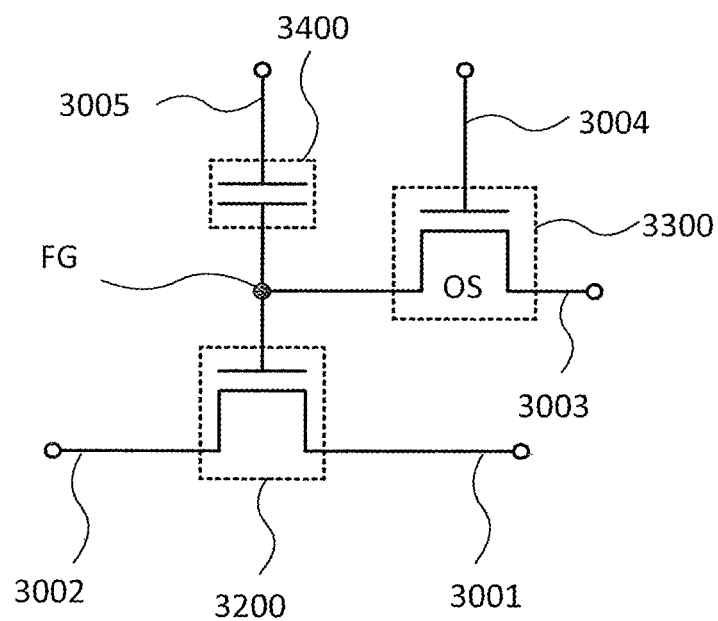
FIGS. 18A and 18B are each a circuit diagram of a memory device of one embodiment of the present invention.
Figure 18B:
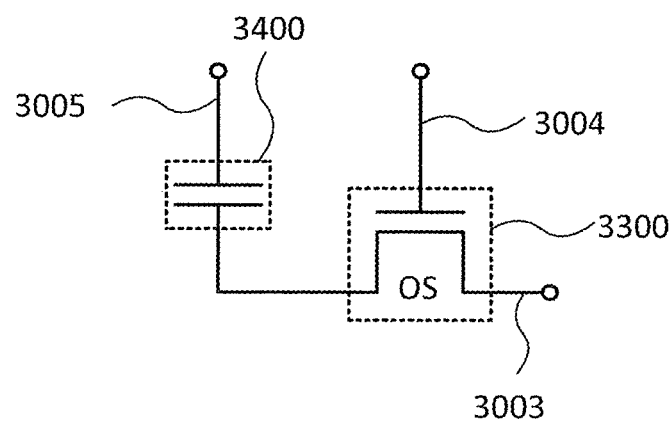

An example of a semiconductor device (memory device) which includes the transistor of one embodiment of the present invention, which can retain stored data even when not powered, and which has an unlimited number of write cycles is shown in FIGS. 18A and 18B.

The semiconductor device illustrated in FIG. 18A includes a transistor 3200 using a first semiconductor, a transistor 3300 using a second semiconductor, and a capacitor 3400. Note that any of the above-described transistors can be used as the transistor 3300.

The transistor 3300 is a transistor using an oxide semiconductor. Since the off-state current of the transistor 3300 is low, stored data can be retained for a long period at a predetermined node of the semiconductor device. In other words, power consumption of the semiconductor device can be reduced because refresh operation becomes unnecessary or the frequency of refresh operation can be extremely low.

In FIG. 18A, a first wiring 3001 is electrically connected to a source of the transistor 3200. A second wiring 3002 is electrically connected to a drain of the transistor 3200. A third wiring 3003 is electrically connected to one of the source and the drain of the transistor 3300. A fourth wiring 3004 is electrically connected to the gate of the transistor 3300. The gate of the transistor 3200 and the other of the source and the drain of the transistor 3300 are electrically connected to the one electrode of the capacitor 3400. A fifth wiring 3005 is electrically connected to the other electrode of the capacitor 3400.

The semiconductor device in FIG. 18A has a feature that the potential of the gate of the transistor 3200 can be retained, and thus enables writing, retaining, and reading of data as follows.

Writing and retaining of data are described. First, the potential of the fourth wiring 3004 is set to a potential at which the transistor 3300 is turned on, so that the transistor 3300 is turned on. Accordingly, the potential of the third wiring 3003 is supplied to a node FG where the gate of the transistor 3200 and the one electrode of the capacitor 3400 are electrically connected to each other. That is, a predetermined charge is supplied to the gate of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is turned off, whereby the charge is held at the node FG (retaining).

Since the off-state current of the transistor 3300 is extremely low, the charge of the node FG is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the node FG. This is because in the case of using an n-channel transistor as the transistor 3200, an apparent threshold voltage $V_{th\_H}$ at the time when the high-level charge is given to one of the gate of the transistor 3200 is lower than an apparent threshold voltage $V_{th\_L}$ at the time when the low-level charge is given to the gate of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$, whereby charge supplied to the node FG can be determined. For example, in the case where the high-level charge is supplied to the node FG in writing and the potential of the fifth wiring 3005 is $V_0$ ($>V_{th\_H}$), the transistor 3200 is turned on. On the other hand, in the case where the low-level charge is supplied to the node FG in writing, even when the potential of the fifth wiring 3005 is $V_0$ ($<V_{th\_L}$), the transistor 3200 remains off. Thus, the data retained in the node FG can be read by determining the potential of the second wiring 3002.

Note that in the case where memory cells are arrayed, it is necessary that data of a desired memory cell is read in read operation. In the case where data of the other memory cells is not read, the fifth wiring 3005 may be supplied with a potential at which the transistor 3200 is turned off regardless of the charge supplied to the node FG, that is, a potential lower than $V_{th\_H}$. Alternatively, the fifth wiring 3005 may be supplied with a potential at which the transistor 3200 is turned on regardless of the charge supplied to the node FG, that is, a potential higher than $V_{th\_L}$.

The semiconductor device in FIG. 18B is different form the semiconductor device in FIG. 18A in that the transistor 3200 is not provided. Also in this case, writing and retaining operation of data can be performed in a manner similar to the semiconductor device in FIG. 18A.

Reading of data in the semiconductor device in FIG. 18B is described. When the transistor 3300 is turned on, the third wiring 3003 which is in a floating state and the capacitor 3400 are electrically connected to each other, and the charge is redistributed between the third wiring 3003 and the capacitor 3400. As a result, the potential of the third wiring 3003 is changed. The amount of change in potential of the third wiring 3003 varies depending on the potential of the one electrode of the capacitor 3400 (or the charge accumulated in the capacitor 3400).

For example, the potential of the third wiring 3003 after the charge redistribution is $(C_B \times V_{B0} + C \times V)/(C_B + C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0 (=(C_B \times V_{B0} + C \times V_0)/(C_B + C))$.

Then, by comparing the potential of the third wiring 3003 with a predetermined potential, data can be read.

In this case, a transistor including the first semiconductor may be used for a driver circuit for driving a memory cell, and a transistor including the second semiconductor may be stacked over the driver circuit as the transistor 3300.

When including a transistor using an oxide semiconductor and having an extremely low off-state current, the semiconductor device described above can retain stored data for a long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Further, in the semiconductor device, high voltage is not needed for writing data and deterioration of elements is less likely to occur. Unlike in a conventional nonvolatile memory, for example, it is not necessary to inject and extract electrons into and from a floating gate; thus, a problem such as deterioration of an insulating film is not caused. That is, the semiconductor device of one embodiment of the present invention does not have a limit on the number of times data can be rewritten, which is a problem of a conventional nonvolatile memory, and the reliability thereof is drastically improved. Furthermore, data is written depending on the state of the transistor (on or off), whereby high-speed operation can be easily achieved.

<RFID Tag>

An RFID tag including the transistor or the memory device is described below with reference to FIG. 19.

The RFID tag of one embodiment of the present invention includes a memory circuit, stores data in the memory circuit, and transmits and receives data to/from the outside by using contactless means, for example, wireless communication. With these features, the RFID tag can be used for an individual authentication system in which an object or the like is recognized by reading the individual information, for example. Note that the RFID tag is required to have high reliability in order to be used for this purpose.

A configuration of the RFID tag will be described with reference to FIG. 19. FIG. 19 is a block diagram illustrating a configuration example of an RFID tag.

Figure 19:
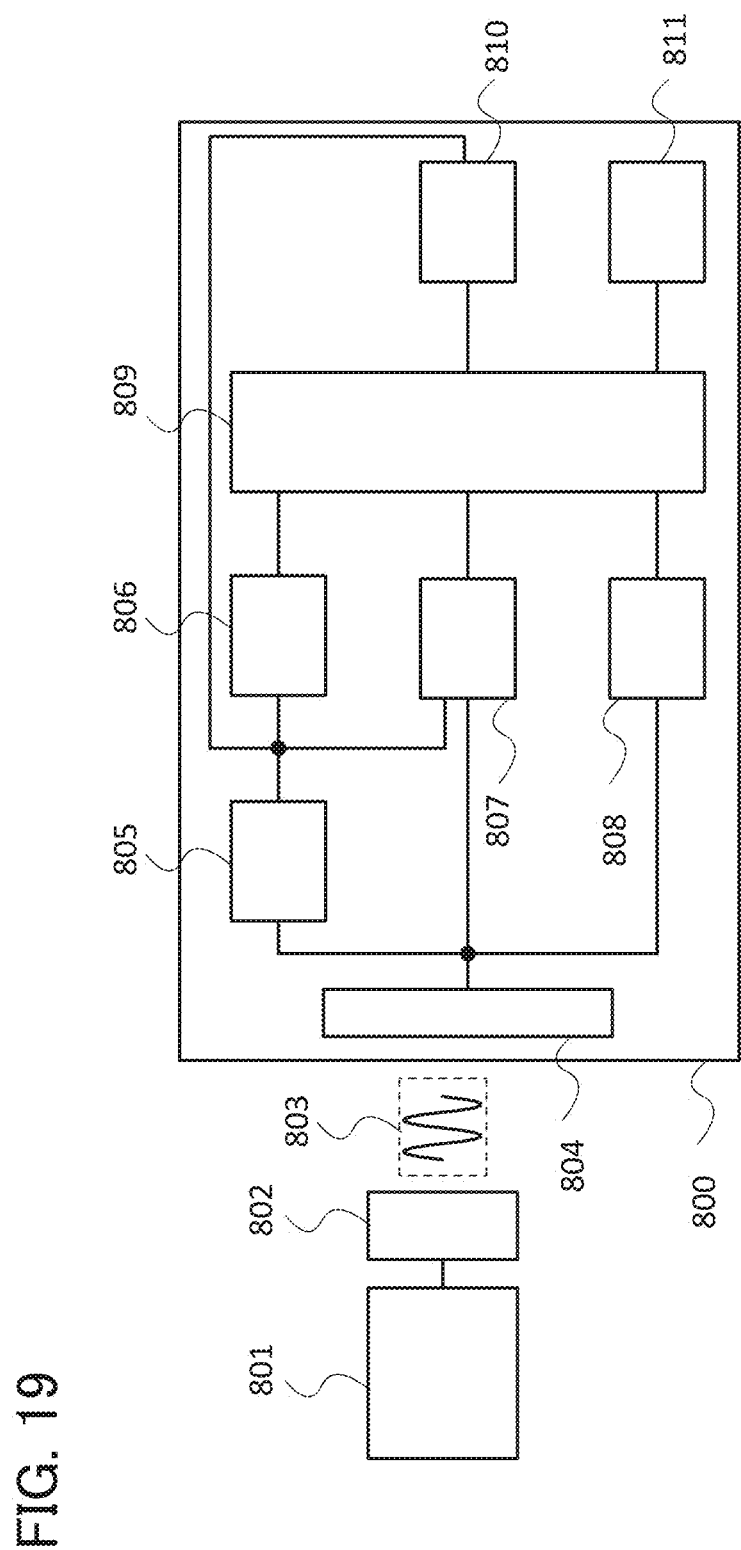
FIG. 19 is a block diagram of an RFID tag of one embodiment of the present invention.
Figure 20A:
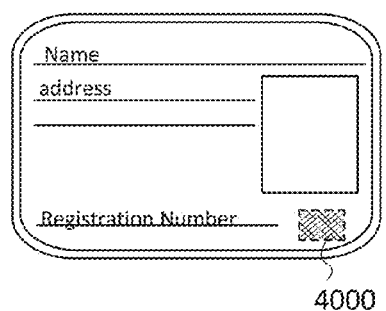
FIGS. 20A to 20F show application examples of an RFID tag of one embodiment of the present invention.
Figure 20B:
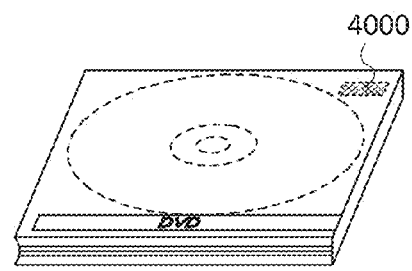
Figure 20C:
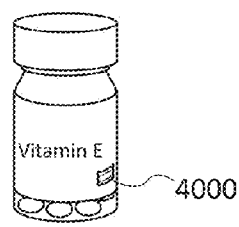
Figure 20D:
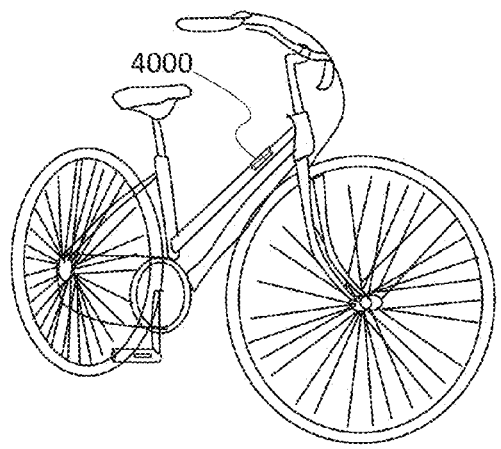
Figure 20E:
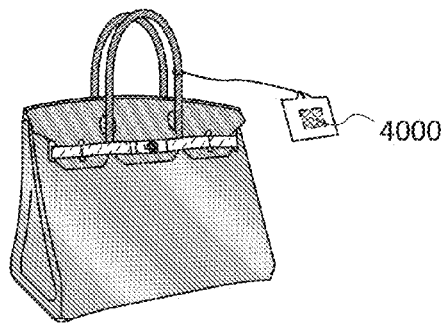
Figure 20F:
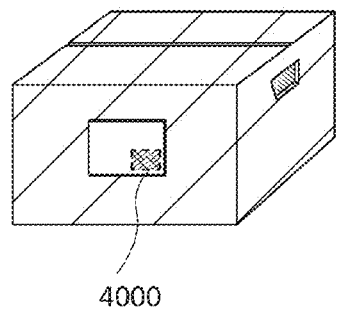

As shown in FIG. 19, an RFID tag 800 includes an antenna 804 which receives a radio signal 803 that is transmitted from an antenna 802 connected to a communication device 801 (also referred to as an interrogator, a reader/writer, or the like). The RFID tag 800 includes a rectifier circuit 805, a constant voltage circuit 806, a demodulation circuit 807, a modulation circuit 808, a logic circuit 809, a memory circuit 810, and a ROM 811. A semiconductor of a transistor having a rectifying function included in the demodulation circuit 807 may be a material which enables a reverse current to be low enough, for example, an oxide semiconductor. This can suppress the phenomenon of a rectifying function becoming weaker due to generation of a reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RFID tag 800.

Next, the structure of each circuit will be described. The antenna 804 exchanges the radio signal 803 with the antenna 802 which is connected to the communication device 801. The rectifier circuit 805 generates an input potential by rectification, for example, half-wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit controls electric power so that electric power which is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit which generates a reset signal of the logic circuit 809 by utilizing rise of the stable power supply voltage.

The demodulation circuit 807 demodulates the input alternating signal by envelope detection and generates the demodulated signal. Further, the modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. Further, the ROM 811 stores an identification number (ID) or the like and outputs it in accordance with processing.

Note that the decision whether each circuit described above is provided or not can be made as appropriate as needed.

Here, the above-described memory device can be used as the memory circuit 810. Since the memory device of one embodiment of the present invention can retain data even when not powered, the memory device is suitable for an RFID tag. Further, the memory device of one embodiment of the present invention needs power (voltage) needed for data writing lower than that needed in a conventional nonvolatile memory; thus, it is possible to prevent a difference between the maximum communication range in data reading and that in data writing. Furthermore, it is possible to suppress malfunction or incorrect writing which is caused by power shortage in data writing.

Since the memory device of one embodiment of the present invention can be used as a nonvolatile memory, it can also be used as the ROM 811. In this case, it is preferable that a manufacturer separately prepare a command for writing data to the ROM 811 so that a user cannot rewrite data freely. Since the manufacturer gives identification numbers before shipment and then starts shipment of products, instead of putting identification numbers to all the manufactured RFID tags, it is possible to put identification numbers to only good products to be shipped. Thus, the identification numbers of the shipped products are in series and customer management corresponding to the shipped products is easily performed.

<Application Examples of RFID Tag>

Application examples of the RFID tag of one embodiment of the present invention are shown below with reference to FIGS. 20A to 20F. The RFID tag is widely used and can be provided for, for example, products such as bills, coins, securities, bearer bonds, documents (e.g., driver's licenses or resident's cards, see FIG. 20A), packaging containers (e.g., wrapping paper or bottles, see FIG. 20C), recording media (e.g., DVD software or video tapes, see FIG. 20B), vehicles (e.g., bicycles, see FIG. 20D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 20E and 20F).

An RFID tag 4000 of one embodiment of the present invention is fixed on products by, for example, being attached to a surface thereof or being embedded therein. For example, the RFID tag 4000 is fixed to each product by being embedded in paper of a book, or embedded in an organic resin of a package. The RFID tag 4000 of one embodiment of the present invention is small, thin, and lightweight, so that the design of a product is not impaired even after the RFID tag 4000 of one embodiment of the present invention is fixed thereto. Further, bills, coins, securities, bearer bonds, documents, or the like can have identification functions by being provided with the RFID tag 4000 of one embodiment of the present invention, and the identification functions can be utilized to prevent counterfeits. Moreover, the efficiency of a system such as an inspection system can be improved by providing the RFID tag 4000 of one embodiment of the present invention for packaging containers, recording media, personal belongings, foods, clothing, household goods, electronic devices, or the like. Vehicles can also have higher security against theft or the like by being provided with the RFID tag 4000 of one embodiment of the present invention.

As described above, the RFID tag of one embodiment of the present invention can be used for the above-described purposes.

<CPU>

A CPU including a semiconductor device such as any of the above-described transistors or the above-described memory device is described below.

Figure 21:
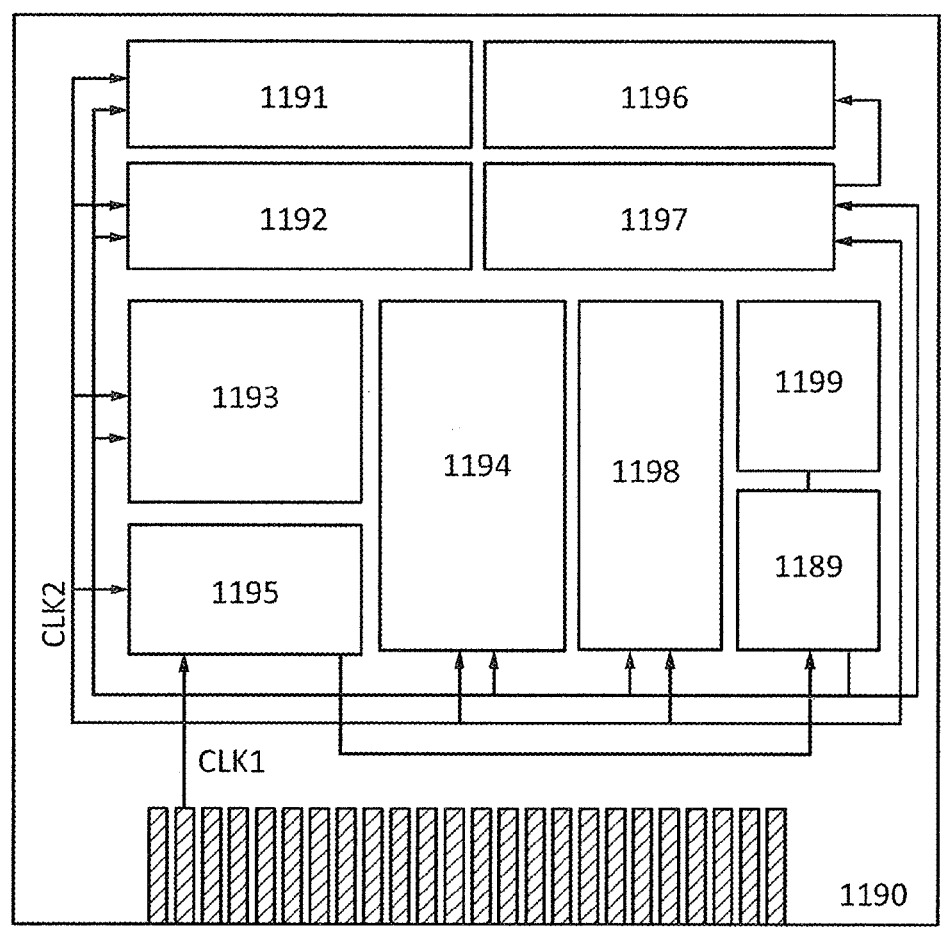
FIG. 21 is a block diagram illustrating a CPU of one embodiment of the present invention.

FIG. 21 is a block diagram illustrating a configuration example of a CPU including any of the above-described transistors as a component.

The CPU illustrated in FIG. 21 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198 (Bus I/F), a rewritable ROM 1199, and an ROM interface 1189 (ROM I/F). A semiconductor substrate, an SOI substrate, a glass substrate, or the like is used as the substrate 1190. The rewritable ROM 1199 and the ROM interface 1189 may be provided over a separate chip. Needless to say, the CPU in FIG. 21 is just an example in which the configuration has been simplified, and an actual CPU may have a variety of configurations depending on the application. For example, the CPU may have the following configuration: a structure including the CPU illustrated in FIG. 21 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 21, a memory cell is provided in the register 1196. For the memory cell of the register 1196, any of the above-described transistors, the above-described memory device, or the like can be used.

In the CPU illustrated in FIG. 21, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of power supply voltage to the memory cell in the register 1196 can be stopped.

Figure 22:
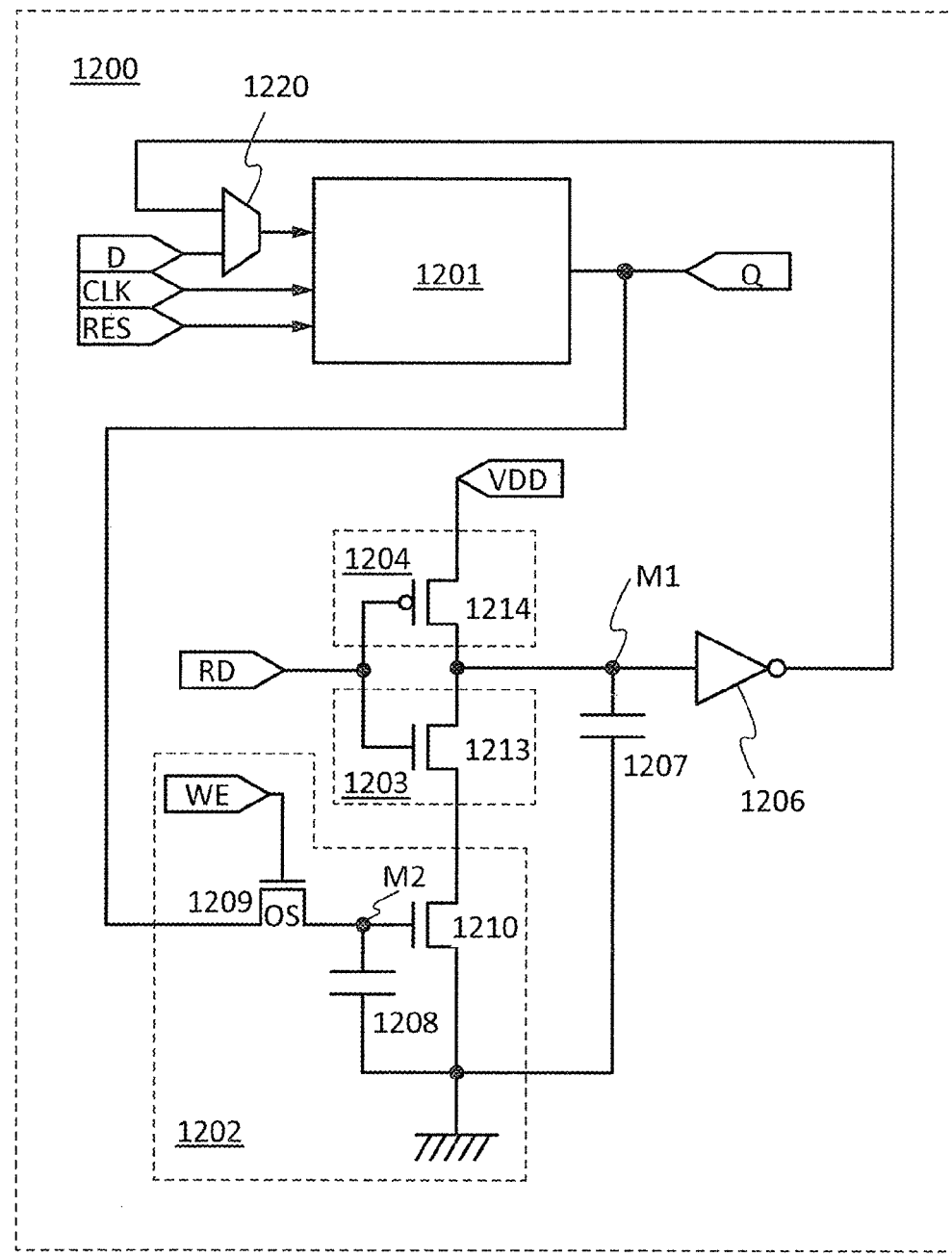
FIG. 22 is a circuit diagram of a memory element of one embodiment of the present invention.

FIG. 22 is an example of a circuit diagram of a memory element that can be used as the register 1196. A memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the above-described memory device can be used as the circuit 1202. When supply of a power supply voltage to the memory element 1200 is stopped, GND (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes of the capacitor 1208 can be supplied with the low power supply potential (e.g., GND) or the high power supply potential (e.g., VDD). The other of the pair of electrodes of the capacitor 1208 is electrically connected to the line which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the gate of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 22 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 22, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 22, the transistors included in the memory element 1200 except for the transistor 1209 can each be a transistor in which a channel is formed in a film formed using a semiconductor other than an oxide semiconductor or in the substrate 1190. For example, the transistor can be a transistor whose channel is formed in a silicon film or a silicon substrate. Alternatively, all the transistors in the memory element 1200 may be a transistor in which a channel is formed in an oxide semiconductor film. Further alternatively, in the memory element 1200, a transistor in which a channel is formed in an oxide semiconductor film can be included besides the transistor 1209, and a transistor in which a channel is formed in a layer or the substrate 1190 including a semiconductor other than an oxide semiconductor can be used for the rest of the transistors.

As the circuit 1201 in FIG. 22, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor film is extremely low. For example, the off-state current of a transistor in which a channel is formed in an oxide semiconductor film is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory element 1200 is used in a CPU, the memory element 1200 can also be used in an LSI such as a digital signal processor (DSP), a custom LSI, or a programmable logic device (PLD), and a radio frequency identification (RF-ID).

<Display Device>

The following shows configuration examples of a display device of one embodiment of the present invention.

Configuration Example

Figure 23A:
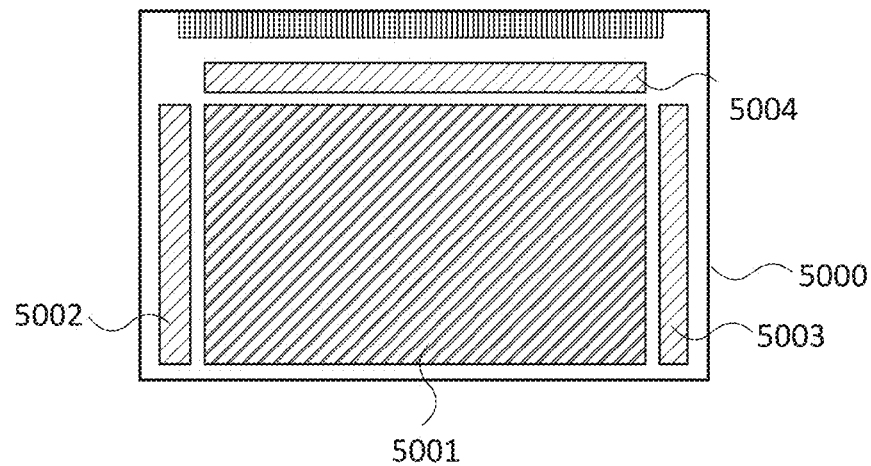
FIGS. 23A to 23C are a top view and circuit diagrams of a display device of one embodiment of the present invention.
Figure 23B:
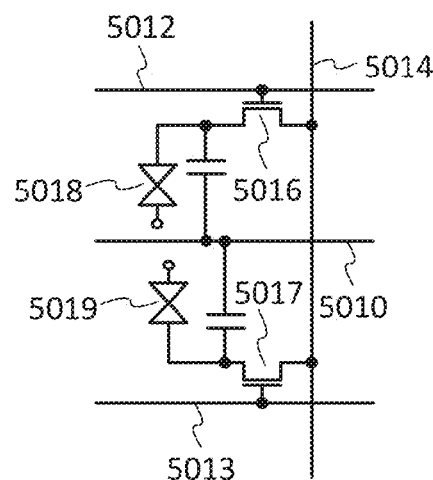
Figure 23C:
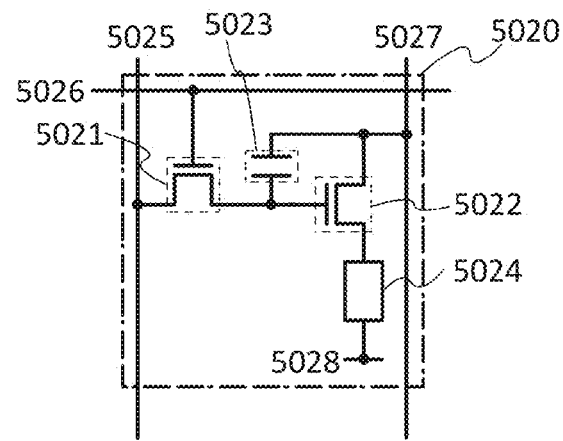

FIG. 23A is a top view of a display device of one embodiment of the present invention. FIG. 23B illustrates a pixel circuit where a liquid crystal element is used for a pixel of a display device of one embodiment of the present invention. FIG. 23C illustrates a pixel circuit where an organic EL element is used for a pixel of a display device of one embodiment of the present invention.

Any of the above-described transistors can be used as a transistor used for the pixel. Here, an example in which an n-channel transistor is used is shown. Note that a transistor manufactured through the same steps as the transistor used for the pixel may be used for a driver circuit. Thus, by using any of the above-described transistors for a pixel or a driver circuit, the display device can have high display quality and/or high reliability.

FIG. 23A illustrates an example of an active matrix display device. A pixel portion 5001, a first scan line driver circuit 5002, a second scan line driver circuit 5003, and a signal line driver circuit 5004 are provided over a substrate 5000 in the display device. The pixel portion 5001 is electrically connected to the signal line driver circuit 5004 through a plurality of signal lines and is electrically connected to the first scan line driver circuit 5002 and the second scan line driver circuit 5003 through a plurality of scan lines. Pixels including display elements are provided in respective regions divided by the scan lines and the signal lines. The substrate 5000 of the display device is electrically connected to a timing control circuit (also referred to as a controller or a control IC) through a connection portion such as a flexible printed circuit (FPC).

The first scan line driver circuit 5002, the second scan line driver circuit 5003, and the signal line driver circuit 5004 are formed over the substrate 5000 where the pixel portion 5001 is formed. Therefore, a display device can be manufactured at cost lower than that in the case where a driver circuit is separately formed. Further, in the case where a driver circuit is separately formed, the number of wiring connections is increased. By providing the driver circuit over the substrate 5000, the number of wiring connections can be reduced. Accordingly, the reliability and/or yield can be improved.

[Liquid Crystal Display Device]

FIG. 23B illustrates an example of a circuit configuration of the pixel. Here, a pixel circuit which is applicable to a pixel of a VA liquid crystal display device, or the like is illustrated.

This pixel circuit can be applied to a structure in which one pixel includes a plurality of pixel electrodes. The pixel electrodes are connected to different transistors, and the transistors can be driven with different gate signals. Accordingly, signals applied to individual pixel electrodes in a multi-domain pixel can be controlled independently.

A gate wiring 5012 of a transistor 5016 and a gate wiring 5013 of a transistor 5017 are separated so that different gate signals can be supplied thereto. In contrast, a source or drain electrode 5014 functioning as a data line is shared by the transistors 5016 and 5017. Any of the above-described transistors can be used as appropriate as each of the transistors 5016 and 5017. Thus, the liquid crystal display device can have high display quality and/or high reliability.

The shapes of a first pixel electrode electrically connected to the transistor 5016 and a second pixel electrode electrically connected to the transistor 5017 are described. The first pixel electrode and the second pixel electrode are separated by a slit. The first pixel electrode has a V shape and the second pixel electrode is provided so as to surround the first pixel electrode.

A gate electrode of the transistor 5016 is electrically connected to the gate wiring 5012, and a gate electrode of the transistor 5017 is electrically connected to the gate wiring 5013. When different gate signals are supplied to the gate wiring 5012 and the gate wiring 5013, operation timings of the transistor 5016 and the transistor 5017 can be varied. As a result, alignment of liquid crystals can be controlled.

Further, a capacitor may be formed using a capacitor wiring 5010, a gate insulating film functioning as a dielectric, and a capacitor electrode electrically connected to the first pixel electrode or the second pixel electrode.

The multi-domain pixel includes a first liquid crystal element 5018 and a second liquid crystal element 5019. The first liquid crystal element 5018 includes the first pixel electrode, a counter electrode, and a liquid crystal layer therebetween. The second liquid crystal element 5019 includes the second pixel electrode, a counter electrode, and a liquid crystal layer therebetween.

Note that a pixel circuit in the display device of one embodiment of the present invention is not limited to that shown in FIG. 23B. For example, a switch, a resistor, a capacitor, a transistor, a sensor, a logic circuit, or the like may be added to the pixel circuit shown in FIG. 23B.

[Organic EL Panel]

FIG. 23C illustrates another example of a circuit configuration of the pixel. Here, a pixel structure of a display device using an organic EL element is shown.

In an organic EL element, by application of voltage to a light-emitting element, electrons are injected from one of a pair of electrodes included in the organic EL element and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

FIG. 23C illustrates an example of a pixel circuit. Here, one pixel includes two n-channel transistors. Note that any of the above-described transistors can be used as the n-channel transistors. Further, digital time grayscale driving can be employed for the pixel circuit.

The configuration of the applicable pixel circuit and operation of a pixel employing digital time grayscale driving will be described.

A pixel 5020 includes a switching transistor 5021, a driver transistor 5022, a light-emitting element 5024, and a capacitor 5023. A gate electrode of the switching transistor 5021 is connected to a scan line 5026, a first electrode (one of a source electrode and a drain electrode) of the switching transistor 5021 is connected to a signal line 5025, and a second electrode (the other of the source electrode and the drain electrode) of the switching transistor 5021 is connected to a gate electrode of the driver transistor 5022. The gate electrode of the driver transistor 5022 is connected to a power supply line 5027 through the capacitor 5023, a first electrode of the driver transistor 5022 is connected to the power supply line 5027, and a second electrode of the driver transistor 5022 is connected to a first electrode (a pixel electrode) of the light-emitting element 5024. A second electrode of the light-emitting element 5024 corresponds to a common electrode 5028. The common electrode 5028 is electrically connected to a common potential line provided over the same substrate.

As each of the switching transistor 5021 and the driver transistor 5022, any of the above-described transistors can be used as appropriate. In this manner, an organic EL display device having high display quality and/or high reliability can be provided.

The potential of the second electrode (the common electrode 5028) of the light-emitting element 5024 is set to be a low power supply potential. Note that the low power supply potential is lower than a high power supply potential supplied to the power supply line 5027. For example, the low power supply potential can be GND, 0 V, or the like. The high power supply potential and the low power supply potential are set to be higher than or equal to the forward threshold voltage of the light-emitting element 5024, and the difference between the potentials is applied to the light-emitting element 5024, whereby current is supplied to the light-emitting element 5024, leading to light emission. The forward voltage of the light-emitting element 5024 refers to a voltage at which a desired luminance is obtained, and includes at least forward threshold voltage.

Note that gate capacitance of the driver transistor 5022 may be used as a substitute for the capacitor 5023 in some cases, so that the capacitor 5023 can be omitted. The gate capacitance of the driver transistor 5022 may be formed between the channel formation region and the gate electrode.

Next, a signal input to the driver transistor 5022 is described. In the case of a voltage-input voltage driving method, a video signal for turning on or off the driver transistor 5022 is input to the driver transistor 5022. In order for the driver transistor 5022 to operate in a linear region, voltage higher than the voltage of the power supply line 5027 is applied to the gate electrode of the driver transistor 5022. Note that voltage higher than or equal to voltage which is the sum of power supply line voltage and the threshold voltage $V_{th}$ of the driver transistor 5022 is applied to the signal line 5025.

In the case of performing analog grayscale driving, a voltage higher than or equal to a voltage which is the sum of the forward voltage of the light-emitting element 5024 and the threshold voltage $V_{th}$ of the driver transistor 5022 is applied to the gate electrode of the driver transistor 5022. A video signal by which the driver transistor 5022 is operated in a saturation region is input, so that current is supplied to the light-emitting element 5024. In order for the driver transistor 5022 to operate in a saturation region, the potential of the power supply line 5027 is set higher than the gate potential of the driver transistor 5022. When an analog video signal is used, it is possible to supply current to the light-emitting element 5024 in accordance with the video signal and perform analog grayscale driving.

Note that in the display device of one embodiment of the present invention, a pixel configuration is not limited to that shown in FIG. 23C. For example, a switch, a resistor, a capacitor, a sensor, a transistor, a logic circuit, or the like may be added to the pixel circuit shown in FIG. 23C.

In the case where any of the above-described transistors is used for the circuit shown in FIGS. 23A to 23C, the source electrode (the first electrode) is electrically connected to the low potential side and the drain electrode (the second electrode) is electrically connected to the high potential side. Further, the potential of the first gate electrode may be controlled by a control circuit or the like and the potential described above as an example, e.g., a potential lower than the potential applied to the source electrode, may be input to the second gate electrode.

<Module>

A display module using a semiconductor device of one embodiment of the present invention is described below with reference to FIG. 24.

Figure 24:
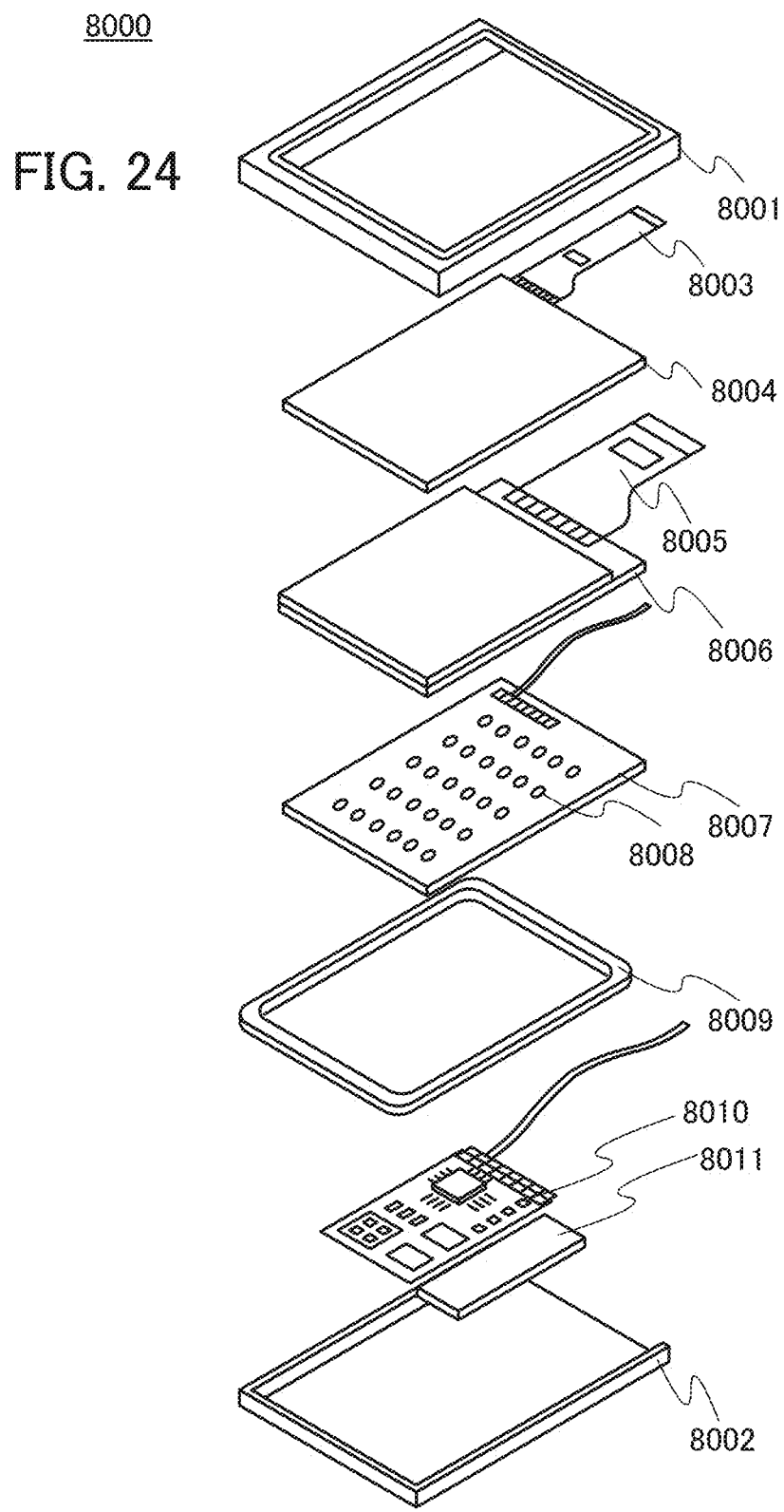
FIG. 24 illustrates a display module of one embodiment of the present invention.

In a display module 8000 in FIG. 24, a touch panel 8004 connected to an FPC 8003, a cell 8006 connected to an FPC 8005, a backlight unit 8007, a frame 8009, a printed board 8010, and a battery 8011 are provided between an upper cover 8001 and a lower cover 8002. Note that the backlight unit 8007, the battery 8011, the touch panel 8004, and the like are not provided in some cases.

The semiconductor device of one embodiment of the present invention can be used for the cell 8006, for example.

The shapes and sizes of the upper cover 8001 and the lower cover 8002 can be changed as appropriate in accordance with the sizes of the touch panel 8004 and the cell 8006.

The touch panel 8004 can be a resistive touch panel or a capacitive touch panel and may be formed to overlap with the cell 8006. A counter substrate (sealing substrate) of the cell 8006 can have a touch panel function. A photosensor may be provided in each pixel of the cell 8006 so that an optical touch panel is obtained. An electrode for a touch sensor may be provided in each pixel of the cell 8006 so that a capacitive touch panel is obtained.

The backlight unit 8007 includes a light source 8008. The light source 8008 may be provided at an end portion of the backlight unit 8007 and a light diffusing plate may be used.

The frame 8009 may protect the cell 8006 and also function as an electromagnetic shield for blocking electromagnetic waves generated by the operation of the printed board 8010. The frame 8009 may function as a radiator plate.

The printed board 8010 has a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 can be additionally provided with a member such as a polarizing plate, a retardation plate, or a prism sheet <Electronic Device>

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are mobile phones, game machines including portable game consoles, portable data appliances, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 25A to 25F illustrate specific examples of these electronic devices.

Figure 25A:
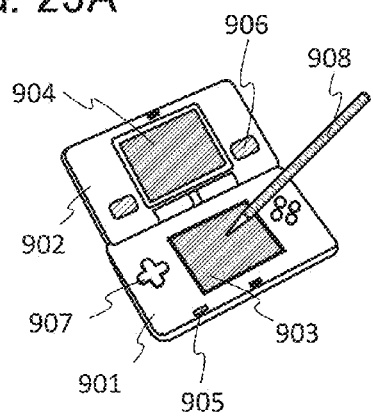
FIGS. 25A to 25F each illustrate an electronic device of one embodiment of the present invention.

FIG. 25A illustrates a portable game console including a housing 901, a housing 902, a display portion 903, a display portion 904, a microphone 905, a speaker 906, an operation key 907, a stylus 908, and the like. Although the portable game machine in FIG. 25A has the two display portions 903 and 904, the number of display portions included in a portable game machine is not limited to this.

Figure 25B:
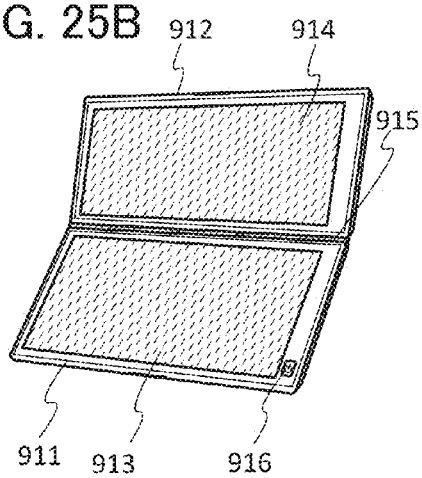

FIG. 25B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched depending on the angle between the first housing 911 and the second housing 912 at the joint 915. A display device with a position input function may be used as at least one of the first display portion 913 and the second display portion 914. Note that the position input function can be added by providing a touch panel in a display device. Alternatively, the position input function can be added by provision of a photoelectric conversion element called a photosensor in a pixel portion of a display device.

Figure 25C:
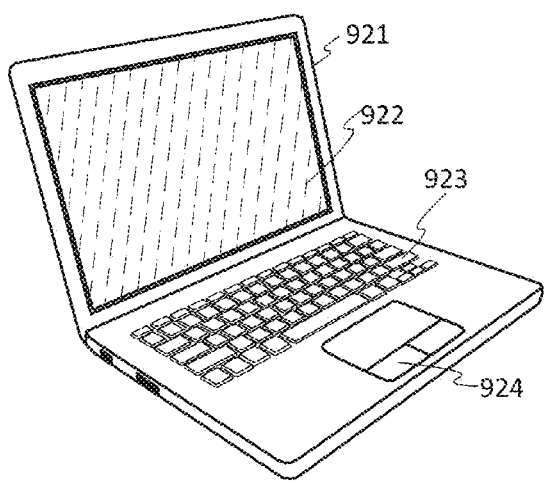

FIG. 25C illustrates a laptop personal computer, which includes a housing 921, a display portion 922, a keyboard 923, a pointing device 924, and the like.

Figure 25D:
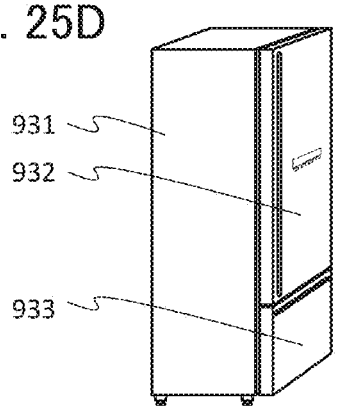

FIG. 25D illustrates the electric refrigerator-freezer including a housing 931, a door for a refrigerator 932, a door for a freezer 933, and the like.

Figure 25E:
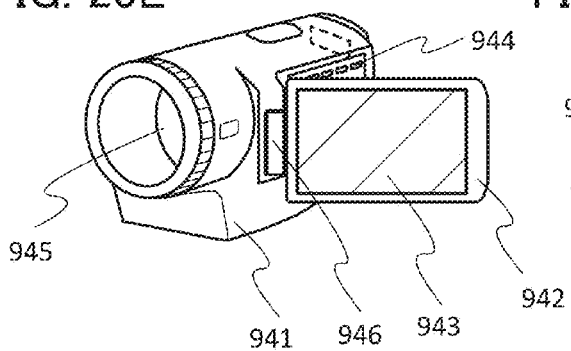

FIG. 25E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 25F:
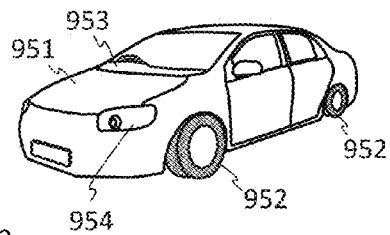

FIG. 25F illustrates an ordinary vehicle including a car body 951, wheels 952, a dashboard 953, lights 954, and the like.

Reference Example

Figure 26:
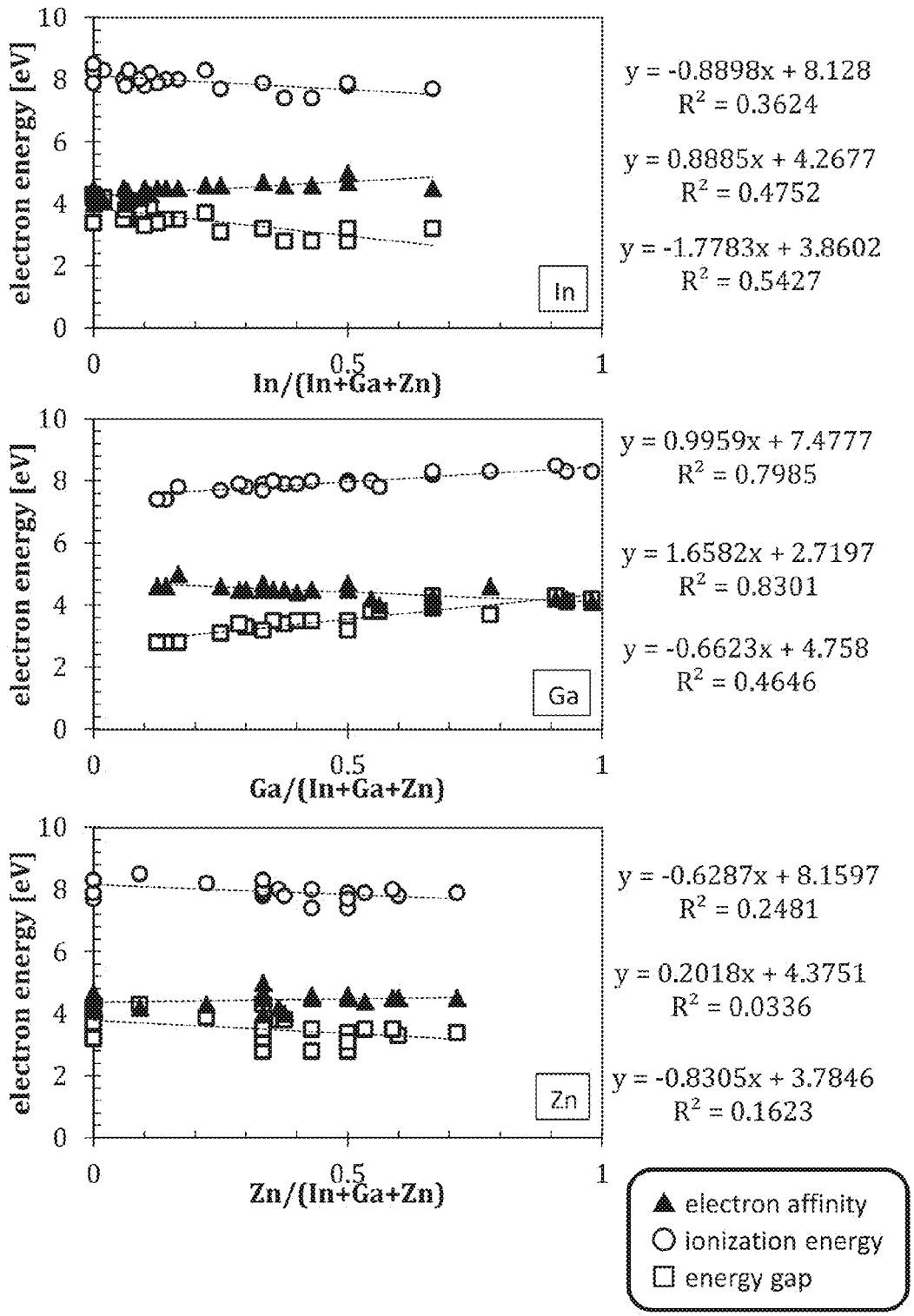
FIG. 26 shows examples of relationships between composition of an oxide and electron affinity, ionization energy, and an energy gap.

The description of the semiconductor film of the transistor according to one embodiment of the present invention shows that the band diagram can be controlled by the composition of the semiconductor film. As an example of the case where the band diagram can be controlled by the composition of the semiconductor film, relationships between composition of an oxide containing two kinds or more selected from indium, gallium, and zinc and electron affinity (represented by black triangles), ionization energy (represented by white squares), and energy gaps (represented by white circles) are shown in FIG. 26. In FIG. 26, atomic ratios of starting materials are used.

A top graph in FIG. 26 indicates that the higher the proportion of indium (In/(In +Ga+Zn)) is, the higher the electron affinity is. In addition, it is found that the higher the proportion of indium is, the lower the ionization energy is, and that the higher the proportion of indium is, the lower the energy gap is.

A middle graph in FIG. 26 indicates that, the higher the proportion of gallium (Ga/(In+Ga+Zn)) is, the lower the electron affinity is. In addition, it is found that the higher the proportion of gallium is, the higher the ionization energy is, and that the higher the proportion of gallium is, the higher the energy gap is.

A bottom graph in FIG. 26 indicates that there is hardly any correlation between the proportion of zinc (Zn/(In+Ga+Zn)) and the electron affinity, between the proportion of zinc and the ionization energy, and between the proportion of zinc and the energy gap. That is, it is found that the proportion of zinc contributes less to the control of the band diagram.

Thus, as shown in FIG. 26, it is found that the band diagram can be controlled by the composition of indium, gallium, and zinc. In particular, the proportion of gallium facilitates control of the band diagram. Here, an example in which an oxide containing two kinds or more selected from indium, gallium, and zinc is used is shown; however, the composition that can control the band diagram is not limited to this.

REFERENCE NUMERALS

100: substrate, 102: insulating film, 104: conductive film, 106: semiconductor film, 112: insulating film, 116*a*: con- This application is based on Japanese Patent Application serial no. 2013-190136 filed with Japan Patent Office on Sep. 13, 2013, the entire contents of which are hereby incorporated by reference.

The invention claimed is:

1. A semiconductor device comprising:
an insulating film;
an oxide semiconductor film over the insulating film;
a gate electrode; and
a gate insulating film between the oxide semiconductor film and the gate electrode,
wherein the oxide semiconductor film contains indium, an element M, and zinc, and
wherein the oxide semiconductor film has an element M concentration gradient that decreases toward the insulating film.

2. The semiconductor device according to claim 1, wherein the element M is aluminum, gallium, yttrium, or tin.

3. The semiconductor device according to claim 1, wherein the oxide semiconductor film includes a zinc oxide layer being in contact with the gate insulating film and having a thickness of 0.1 atomic layers or more and 20 atomic layers or less.

4. A semiconductor device comprising:
a first insulating film;
an oxide semiconductor film over the first insulating film;
a second insulating film over the oxide semiconductor film; and
wherein the oxide semiconductor film contains indium, an element M, and zinc, and
wherein the oxide semiconductor film has an element M concentration gradient that decreases toward the first insulating film and an element M concentration gradient that decreases toward the second insulating film.

5. The semiconductor device according to claim 4, wherein the element M is aluminum, gallium, yttrium, or tin.

6. The semiconductor device according to claim 4, wherein the oxide semiconductor film includes a zinc oxide layer being in contact with the first insulating film and having a thickness of 0.1 atomic layers or more and 20 atomic layers or less.

7. A semiconductor device comprising:
a first insulating film;
an oxide semiconductor film over the first insulating film;
a second insulating film over the oxide semiconductor film; and
wherein the oxide semiconductor film contains indium, an element M, and zinc, and
wherein the oxide semiconductor film has a concentration gradient so that the electron affinity increases toward the first insulating film and a concentration gradient so that the electron affinity increases toward the second insulating film.

8. The semiconductor device according to claim 7, wherein the element M is aluminum, gallium, yttrium, or tin.

9. The semiconductor device according to claim 7, wherein the oxide semiconductor film includes a zinc oxide layer being in contact with the first insulating film and having a thickness of 0.1 atomic layers or more and 20 atomic layers or less.

* * * * *